US011202375B2

(12) United States Patent
Liu et al.

(10) Patent No.: US 11,202,375 B2
(45) Date of Patent: Dec. 14, 2021

(54) SURFACE MOUNT PASSIVE COMPONENT SHORTED TOGETHER

(71) Applicant: QUALCOMM Incorporated, San Diego, CA (US)

(72) Inventors: Yu-Chun Liu, Altamonte Springs, FL (US); Peter Mark Davulis, Altamonte Springs, FL (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/794,336

(22) Filed: Feb. 19, 2020

(65) Prior Publication Data

US 2020/0344894 A1 Oct. 29, 2020

Related U.S. Application Data

(60) Provisional application No. 62/839,882, filed on Apr. 29, 2019.

(51) Int. Cl.
*H05K 3/32* (2006.01)
*H05K 1/18* (2006.01)
*H05K 1/11* (2006.01)
*H05K 3/40* (2006.01)
*H05K 3/46* (2006.01)

(52) U.S. Cl.
CPC ............... *H05K 3/32* (2013.01); *H05K 1/115* (2013.01); *H05K 1/181* (2013.01); *H05K 1/182* (2013.01); *H05K 3/4038* (2013.01); *H05K 3/46* (2013.01); *H05K 2201/1003* (2013.01); *H05K 2201/10015* (2013.01); *H05K 2201/10022* (2013.01); *H05K 2201/10719* (2013.01)

(58) Field of Classification Search
CPC .......... H05K 3/32; H05K 1/181; H05K 1/182; H05K 1/115; H05K 2201/10719; H05K 2201/10015; H05K 2201/10022; H05K 2201/1003
USPC ......................................................... 361/782
See application file for complete search history.

(56) References Cited

U.S. PATENT DOCUMENTS

| 5,493,259 | A | * | 2/1996 | Blalock ................ H05K 1/0231 |
| | | | | 333/182 |
| 5,561,584 | A | | 10/1996 | Tang |
| 5,861,854 | A | * | 1/1999 | Kawahata ............... H01Q 1/243 |
| | | | | 343/700 MS |
| 6,611,419 | B1 | * | 8/2003 | Chakravorty ..... H01L 23/49822 |
| | | | | 257/E23.062 |
| 6,614,663 | B1 | | 9/2003 | Yokota et al. |
| 2006/0012966 | A1 | * | 1/2006 | Chakravorty ........... H01L 23/50 |
| | | | | 361/763 |
| 2009/0021446 | A1 | | 1/2009 | Kataya et al. |

(Continued)

FOREIGN PATENT DOCUMENTS

EP 1931189 A2 6/2008

*Primary Examiner* — Sherman Ng
(74) *Attorney, Agent, or Firm* — Qualcomm Incorporated

(57) ABSTRACT

A device that includes a substrate including a plurality of metal layers, and a plurality of dielectric layers. The device further includes a first passive component including a first terminal, a second terminal, and a first body, mounted to the substrate on one of the plurality of metal layers. The first terminal is coupled to a first ground signal and the second terminal is coupled to a second ground signal such that the first passive component is shorted.

19 Claims, 19 Drawing Sheets

(56) References Cited

U.S. PATENT DOCUMENTS

| | | | |
|---|---|---|---|
| 2009/0267851 A1* | 10/2009 | Morris, III | H01Q 23/00 343/745 |
| 2010/0123630 A1* | 5/2010 | Chou | H01Q 1/48 343/700 MS |
| 2011/0095947 A1* | 4/2011 | Chou | H01Q 5/371 343/700 MS |
| 2012/0081869 A1* | 4/2012 | Kim | H04B 15/02 361/782 |
| 2014/0110820 A1 | 4/2014 | Standing et al. | |
| 2015/0183456 A1* | 7/2015 | Nishimura | H05K 1/0203 318/139 |
| 2017/0263570 A1* | 9/2017 | Lin | H01L 25/0655 |
| 2020/0343201 A1 | 10/2020 | Liu et al. | |

\* cited by examiner

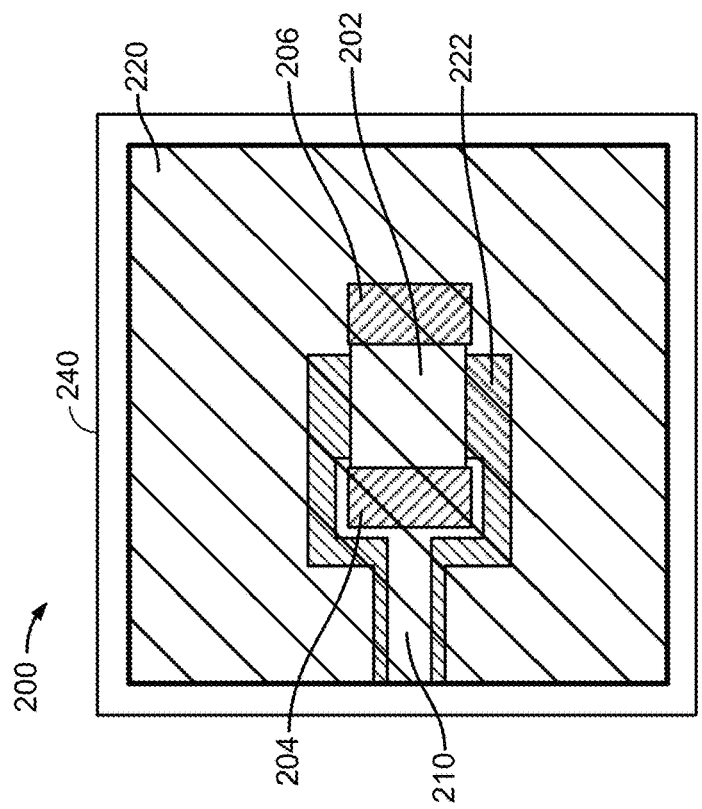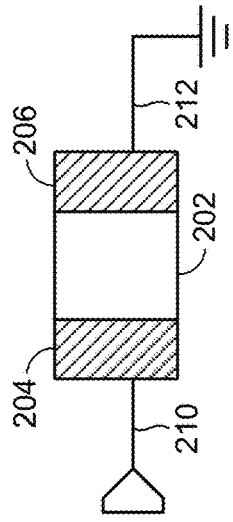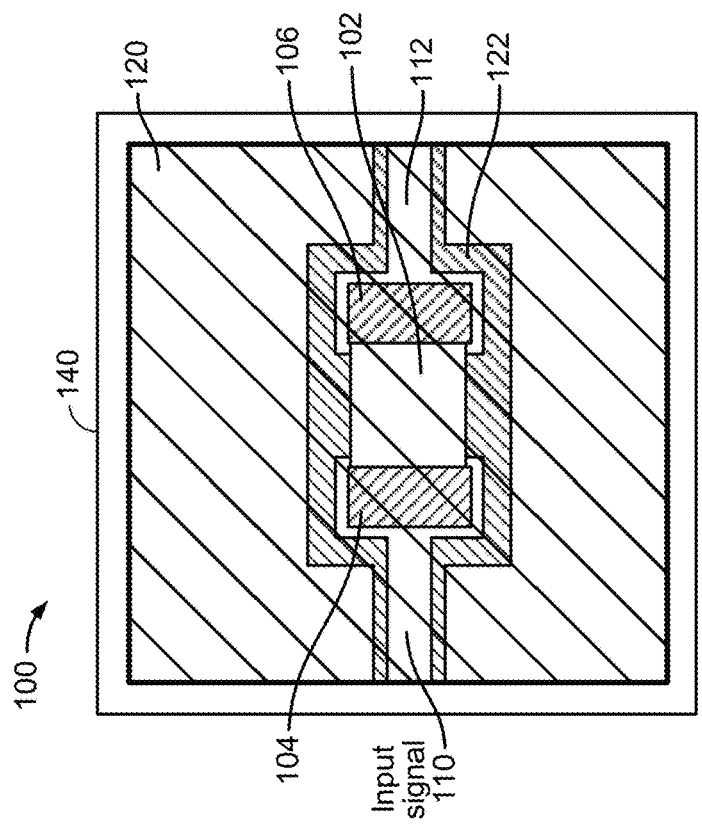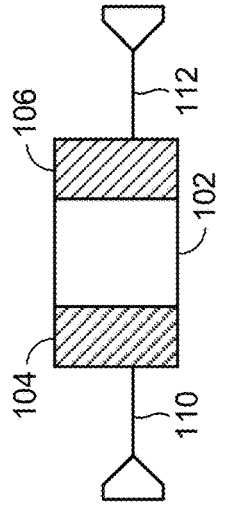
FIG. 1A
FIG. 1B
FIG. 2A
FIG. 2B

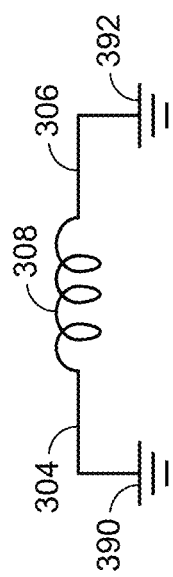
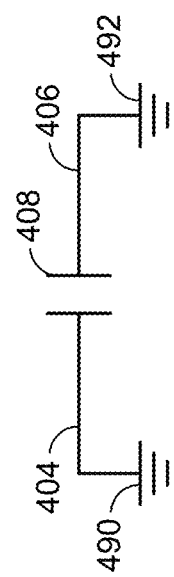
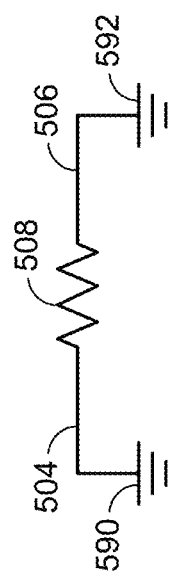
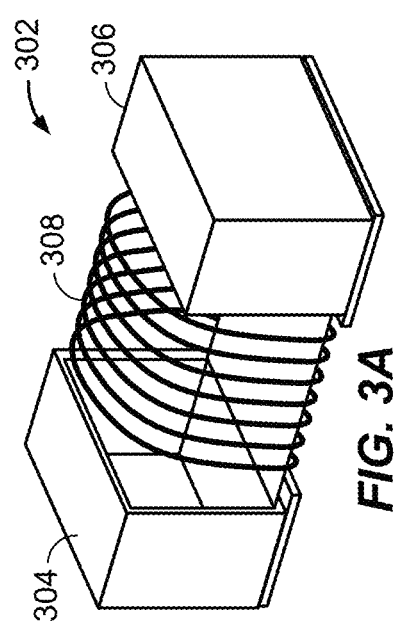
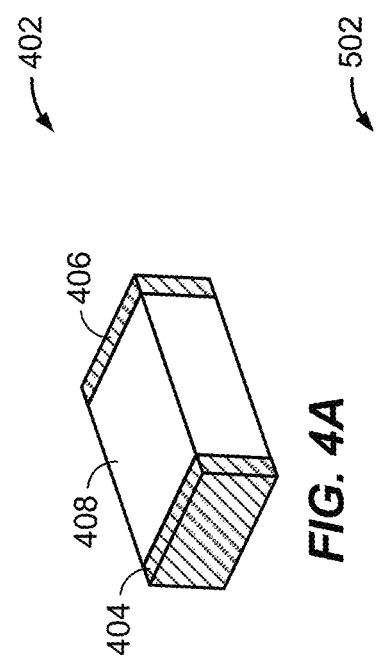
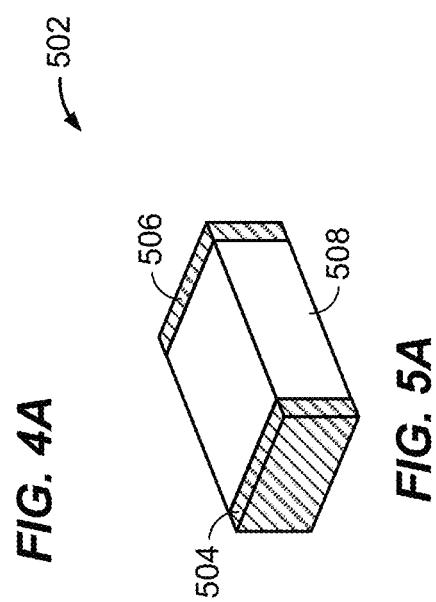

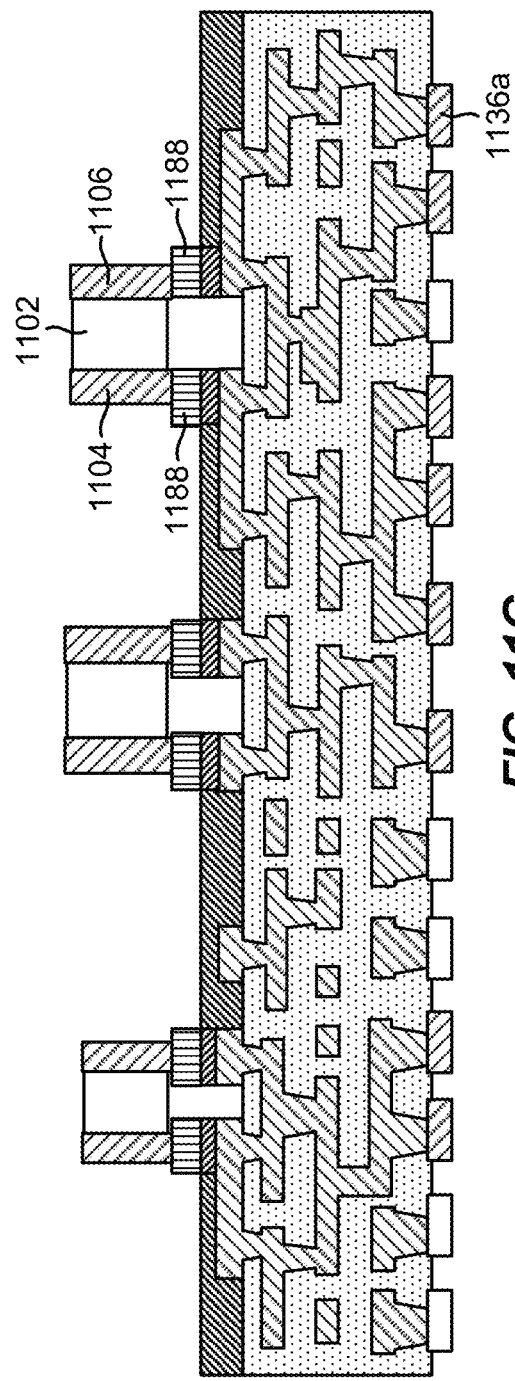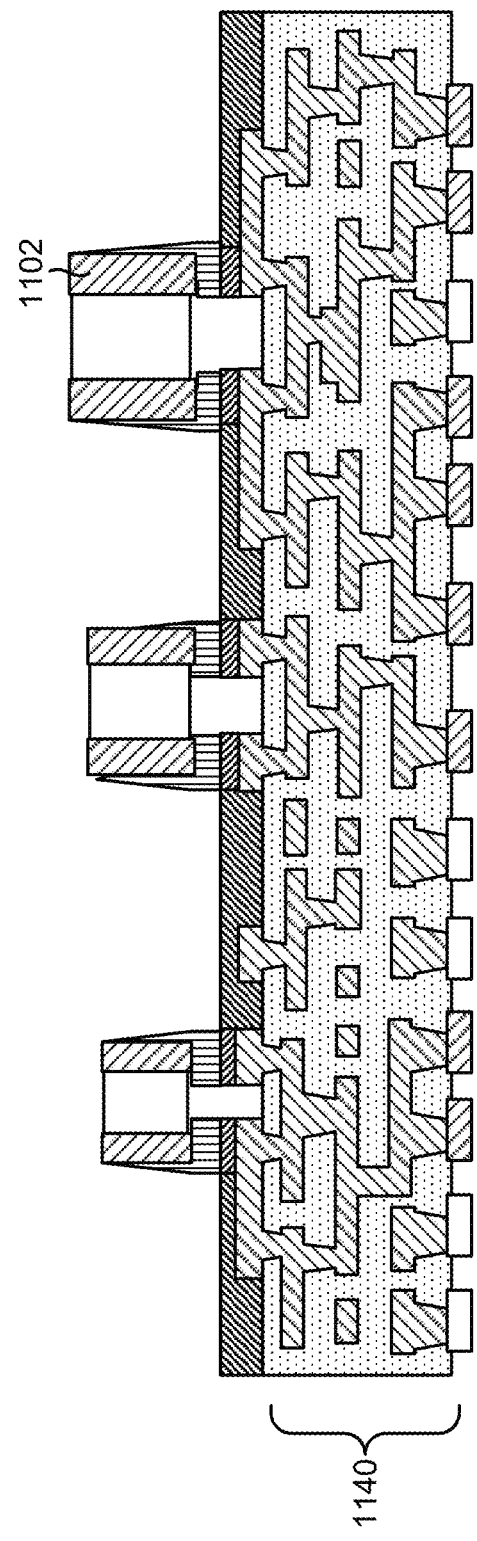
FIG. 11G
FIG. 11H

SURFACE MOUNT PASSIVE COMPONENT SHORTED TOGETHER

CLAIM OF PRIORITY

The present Application for Patent claims priority to Application No. 62/839,882 entitled "SURFACE MOUNT PASSIVE COMPONENT SHORTED TOGETHER" filed Apr. 29, 2019, and assigned to the assignee hereof and hereby expressly incorporated by reference herein.

BACKGROUND

Field

Various features relate to devices that includes a substrate, a surface mount passive component that is shorted and mounted to the substrate.

Background

Surface mount technology (SMT) is a technology where components are mounted or placed directly onto a surface of a printed circuit board or package substrate. Passive components such as resistors, capacitors and inductors may be surface mounted onto package substrates for use in filters, radio frequency applications (RF), voltage regulation, and other applications.

There is an ongoing need to provide smaller devices with cost effective design structures to solve problems in smaller devices such as electromagnetic interference, heat dissipation and effective inductance tuning.

SUMMARY

Various features relate to devices that includes a substrate, a surface mount passive component that is shorted and mounted to the substrate.

A first example provides a device that includes a substrate including a plurality of metal layers, and a plurality of dielectric layers. The device further includes a first passive component including a first terminal, a second terminal, and a first body, mounted to the substrate on one of the plurality of metal layers. The first terminal is coupled to a first ground signal and the second terminal is coupled to a second ground signal such that the first passive component is shorted.

A second example provides a method of fabricating a packaged passive component including providing a substrate including a plurality of metal layers, and a plurality of dielectric layers. The method further includes mounting a first passive component to the substrate on one of the plurality of metal layers, the first passive including a first terminal, a second terminal, and a first body, and coupling the first terminal to a first ground signal and the second terminal to a second ground signal, such that the first component is shorted.

BRIEF DESCRIPTION OF THE DRAWINGS

Various features, nature and advantages may become apparent from the detailed description set forth below when taken in conjunction with the drawings in which like reference characters identify correspondingly throughout.

FIG. 1A illustrates a top view of a packaged surface mount device connected in a series configuration.

FIG. 1B illustrates a simplified circuit view of the packaged surface mount device of FIG. 1A.

FIG. 2A illustrates a top view of a packaged surface mount device connected in a shunt configuration.

FIG. 2B illustrates a simplified circuit view of the packaged surface mount device of FIG. 2A.

FIGS. 3A and 3B illustrate a first passive component that is inductive.

FIGS. 4A and 4B illustrate a first passive component that is capacitive.

FIGS. 5A and 5B illustrate a first passive component that is resistive.

FIGS. 11A-11I illustrate an exemplary sequence for providing or fabricating a packaged surface mount passive component and optionally coupling the packaged surface mount passive component to a circuit board.

DETAILED DESCRIPTION

Figure 6A:
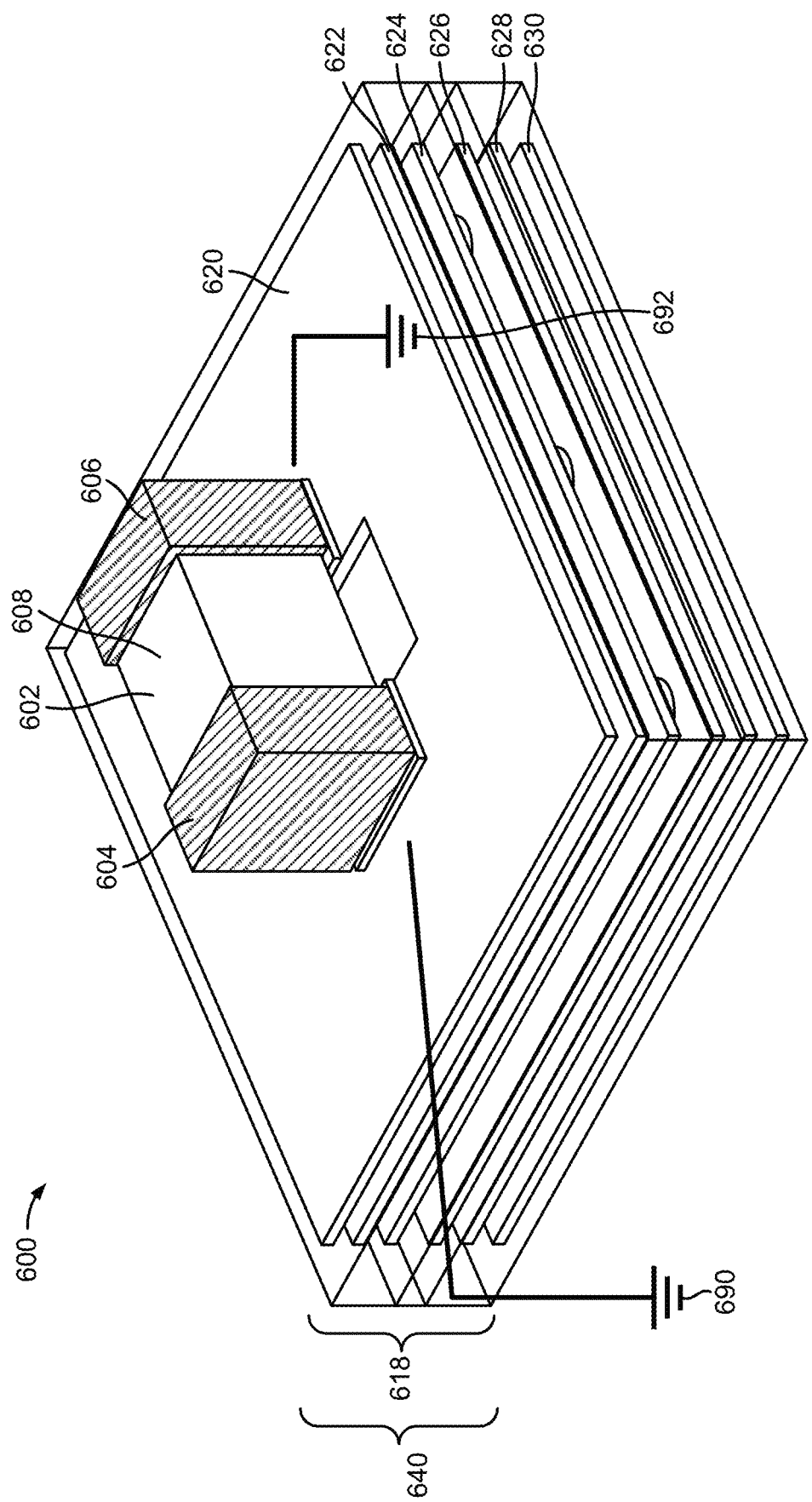
FIGS. 6A, 6B, and 6C illustrate different views of an exemplary packaged surface mount passive component that is shorted.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

The present disclosure describes a device that includes a substrate including a plurality of metal layers, and a plurality of dielectric layers, a first passive component including a first terminal, a second terminal, and a first body, mounted to the substrate on one of the plurality of metal layers. The first terminal is coupled to a first ground signal and the second terminal is coupled to a second ground signal such that the first passive component is shorted. The first passive component may be an inductor, a capacitor, or a resistor.

As used herein, the term "ground" is a conductive point or plane where the potential for the ground or grounded conductive point or plane is taken as the reference potential from which other voltages in the circuit are measured. Furthermore, the grounded conductive point or plane provides a low impedance path for return currents. Such a grounded conductive point or grounded conductive plane such as a metal layer shall be understood to provide a ground signal. Although the grounded conductive point or plane provides a low impedance path, the potential of the grounded conductive point or plane (e.g., the ground signal) need not be at zero voltage.

As used herein, the term "shorted" (or shorted configuration) is used where a first terminal is coupled to a first ground signal and a second terminal is coupled to a second ground signal such that there is a low resistance connection between the first and second terminal or there is a low resistance at each of the first terminal and the second terminal. The term "shorted" does not require that both the first ground signal and the second ground signal be from the same ground source. The first ground signal may be from a first ground source and the second ground signal may be from a second ground source that are different. Alternatively, the first ground signal and the second ground signal may be from the same ground source. Regardless of the ground source, the first ground signal and the second ground signal are at substantially the same ground potential, such that the first terminal and second terminal are shorted.

The first passive component may be mounted or located on any one of the plurality of metal layers such as an inner metal layer (such that the first passive component is embedded in the substrate) or an outer metal layer.

Any one of the plurality of metal layers may be configured to provide the first ground signal and the second ground signal to the first terminal and the second terminal respectively. The first ground signal and the second ground signal may be from the same ground source or from different ground sources. The first ground signal and the second ground signal may receive their respective ground source from the same metal layer (of the plurality of metal layers) or from different metal layers respectively. The first ground signal's ground source may come from a ground plane or ground point. The second ground signal's ground source may come from a ground plane or ground point. Regardless, the first ground signal and the second ground signal are at substantially the same ground potential The first passive component may be co-located on the same metal layer (of the plurality of metal layers) as the metal layer that is configured to provide the first ground signal and the second ground signal. Alternatively, the first passive component may be located on a different metal layer (of the plurality of metal layers), then the metal layer that is configured to provide the first ground signal and/or the second ground signal. Where the first passive component is not co-located on the same metal layer as the metal layer of the first and second ground signals, a plurality of vias allow the first and/or second ground signal to be coupled to the first terminal and/or second terminal.

The aforementioned device may be a packaged passive component. The device may be coupled to a circuit board such as a printed circuit board.

The device including the first passive component that is shorted, provides a low cost way to tune an inductor when the first passive component that is shorted is inductive. For example, one or more passive components that are shorted may be placed near an inductor that is to be tuned to a desired inductance value. The one or more passive components (that are inductive) may be used to tune the inductor that is to be tuned through mutual inductance.

The device including the first passive component that is shorted, provides a low cost way to provide electromagnetic shielding. For example, the passive component may be capacitive. When one or more capacitive passive components that are shorted are placed in between a first and a second die, the passive component that is shorted may operate as an electromagnetic shield.

The device including the first passive component that is shorted, provides a low cost way to provide heat shielding. For example, the passive component may be inductive or resistive. When one or more capacitive or resistive passive components that are shorted are placed in between a heat source (e.g., a first die) and a second die, the passive component that is shorted may operate as a heat shield. That is, the passive component may operate to shield the second die from the heat source.

The device including the first passive component that is shorted, provides a low cost way to provide a heat sink. For example, the passive component may be inductive or resistive. When one or more capacitive or resistive passive components that are shorted are placed near a heat source (e.g., a die), the passive component that is shorted may operate as a heat sink. That is, the passive component may operate to help dissipate heat created by the heat source.

A Packaged Surface Mount Device

FIG. 1A illustrates a top view of a packaged surface mount device 100 connected in a series configuration. The packaged surface mount device 100 includes a surface mount device (SMD) 102 coupled to a first metal layer 120 of a substrate 140. The SMD 102 includes a first terminal 104 and a second terminal 106 coupled to the first metal layer 120 of the substrate. An area of the first metal layer 120 under and immediately around the SMD 102 may be opened in accordance with some design rules, such that a second metal layer 122 underneath the first metal layer 120 may be exposed.

The SMD 102 is coupled in series with another circuit (not shown), such that the first terminal 104 of the SMD 102 is coupled in series with an input signal 110, and the second terminal of the SMD 102 is coupled in series with an output signal 112.

FIG. 1B illustrates a simplified circuit view of the packaged surface mount device 100 of FIG. 1A. Specifically, FIG. 1B illustrates the input signal 110 coupled to the first terminal 104 of the packaged surface mount device 100. Further, the second terminal 106 is coupled to the output signal 112. In other words, the SMD 102 is coupled in series with the input signal 110 and the output signal 112.

FIG. 2A illustrates a top view of a packaged surface mount device 200 connected in a shunt configuration. The packaged surface mount device 200 is similar to the packaged surface mount device 100 of FIGS. 1A and 1B, except one of the terminals is grounded.

Specifically, the packaged surface mount device 200 includes a surface mount device (SMD) 202 coupled to a first metal layer 220 of a substrate 240. The SMD 202 includes a first terminal 204 and a second terminal 206 coupled to the first metal layer 220 of the substrate. An area of the first metal layer 220 under and immediately around the SMD 202 may be opened in accordance with some design rules, such that a second metal layer 222 underneath the first metal layer 220 may be exposed.

The SMD 202 is configured such that the first terminal 204 of the SMD 202 is coupled in series with an input signal 210, and the second terminal 206 of the SMD 202 is coupled to a ground signal 212. That is, the SMD 202 is connected in a shunt configuration (i.e., with one end grounded).

FIG. 2B illustrates a simplified circuit view of the packaged surface mount device 200 of FIG. 2A. Specifically, FIG. 2B illustrates the input signal 210 coupled to the first terminal 204 of the packaged surface mount device 200.

Further, the second terminal 206 is coupled to the ground signal 212. The SMD 202 is configured in a shunt configuration.

FIGS. 1A and 1B illustrate a SMD 102 and 202 respectively, that utilize surface mount technology for coupling or mounting the device to a substrate (e.g., a first metal layer 120 or 220 of a substrate). Specifically, FIG. 1B illustrates the SMD 102 coupled serially (i.e., the first terminal 104 and the second terminal 106 are serially coupled to an input signal 110 and an output signal 112 respectively), whereas FIG. 2B illustrates the SMD coupled in a shunt configuration, i.e., with the first terminal 104 coupled to input signal 210 and the second terminal 206 coupled to the ground signal 212.

Surface mount technology is advantageous when utilized in a shorted configuration where both ends of the terminal are grounded. In a shorted configuration where both ends of the terminal are grounded, a passive surface mounted device may be utilized, as an internal electromagnetic shield, as a tuning inductor, as a heat shield, and as a heat sink. Utilized in such a configuration, surface mount technology gives a simple design structure that provides design options that are low cost.

Surface Mount Passive Component

FIGS. 3A and 3B illustrate a first passive component that is inductive. FIG. 3A includes a cross section view of a first passive component 302, including a first terminal 304, a second terminal 306, and a body 308 that includes an inductor (a winding of metal coils). That is, the first passive component 302 is an inductor. Although FIG. 3A illustrates the first passive component 302 as an inductor with approximately two coils or two windings, this is only an example. The first passive component 302 may have more or less windings than shown.

FIG. 3B illustrates a simplified circuit view of the first passive component 302. Specifically, FIG. 3B illustrates the body 308 of the first passive component 302 as including the inductor 308, and the first terminal 304 is coupled to a first ground signal 390 and the second terminal 306 is coupled to a second ground signal 392 such that the first passive component 302 is shorted (i.e., the first terminal 304 and the second terminal 306 are shorted).

FIGS. 4A and 4B illustrate a first passive component that is capacitive. FIG. 4A illustrates a cross section view of a first passive component 402 including a first terminal 404, a second terminal 406 and a body 408 that includes a capacitor. That is, the first passive component 402 is a capacitor.

FIG. 4B illustrates a simplified circuit view of the first passive component 402. Specifically, FIG. 4B illustrates the body 408 of the first passive component 402 as including the capacitor 408, and the first terminal 404 coupled to a first ground signal 490 and the second terminal 406 is coupled to a second ground signal 492 such that the first passive component 402 is shorted.

FIGS. 5A and 5B illustrate a first passive component that is resistive. FIG. 5A illustrates a cross section view of a first passive component 502 including a first terminal 504, a second terminal 506 and a body 508 that includes a resistor. That is, the first passive component 502 is a resistor.

FIG. 5B illustrates a simplified circuit view of the first passive component 502. Specifically, FIG. 5B illustrates the body 508 of the first passive component 502 as including the resistor 508, and the first terminal 504 is coupled to a first ground signal 590 and the second terminal 506 is coupled to a second ground signal 592 such that the first passive component 502 is shorted.

Exemplary Packaged Surface Mount Passive Component that is Shorted

Figure 6B:
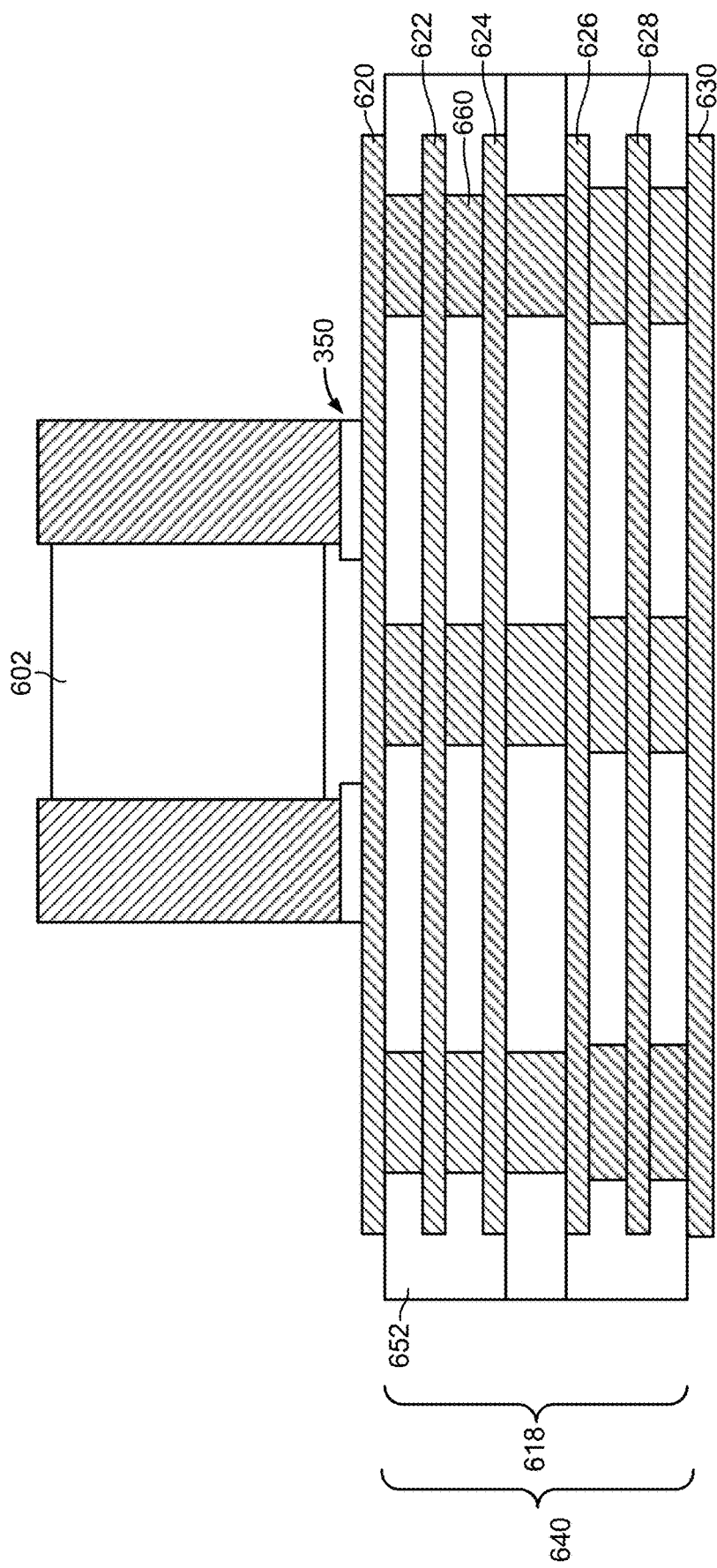
Figure 6C:
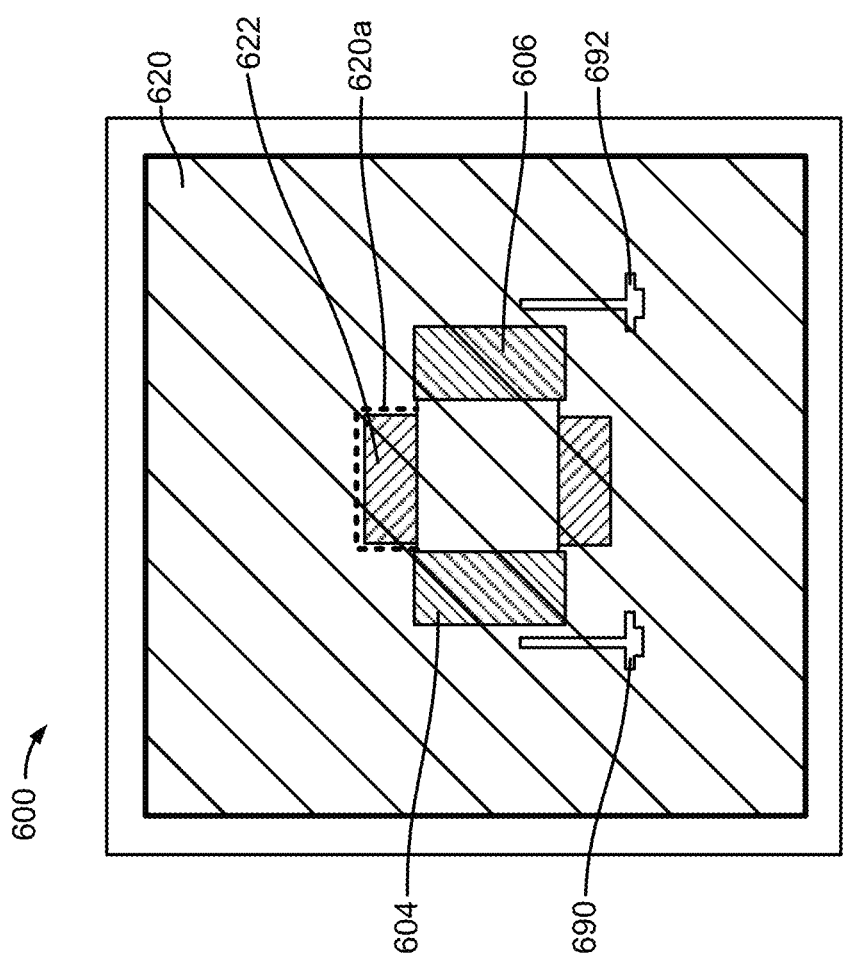

FIGS. 6A, 6B, and 6C illustrate different views of an exemplary packaged surface mount passive component (e.g., device) that is shorted. FIG. 6A illustrates a three dimensional view of a packaged surface mount passive component 600 and FIG. 6B illustrates a cross section view (two dimensional) of the packaged surface mount passive component 600.

FIGS. 6A and 6B illustrate a substrate 640. The substrate 640 may be a package substrate, a printed circuit board (PCB), an interposer, a laminate or organic substrate, a wafer level package or a chip scale package, or any other type of carrier. The substrate 640 includes a plurality of metal layers 618 such as a first metal layer 620, a second metal layer 622, a third metal layer 624, a fourth metal layer 626, a fifth metal layer 628, and a sixth metal layer 630. Although the substrate 640 is illustrated as having six metal layers (i.e., first metal layer 620 through sixth metal layer 630), this is only an example. The substrate 640 may have less metal layers, such as three or four or five metal layers, or it may have more than six metal layers, such as seven metal layers, eight metal layers, nine metal layers, etc.

The substrate 640 has a plurality of dielectric layers 652 as illustrated in FIG. 6B, that alternate between each of the plurality of metal layers 618 (i.e., first metal layer 620 through sixth metal layer 630) so as to provide isolation between each of the plurality of metal layers 618.

Although not illustrated in FIG. 6A for simplicity, FIG. 6B illustrates a plurality of vias 660 configured to electrically couple the plurality of metal layers 618s. For example, a one of the plurality of vias 660 couples the first metal layer 620 to the second metal layer 622. The one of the plurality of vias 660 vertically traverses one of the plurality of dielectric layers 652 to couple the first metal layer 629 to the second metal layer.

FIGS. 6A and 6B further illustrate a first passive component 602. As will be discussed later, the first passive component 602 may be an inductor, a capacitor, or a resistor. The first passive component 602 includes a first terminal 604, a second terminal 606, and a first body 608 mounted to the substrate 640 on one of the plurality of metal layers 618s (e.g., first metal layer 620 through sixth metal layer 630). Specifically, FIGS. 6A and 6B illustrate the first passive component 602, including the first terminal 604 and the second terminal 606, mounted to the first metal layer 620. In another example, the first passive component 602 may also include a third terminal and a fourth terminal (not illustrated). Alternatively, the first passive component 602 may be a multi-terminal component having two terminals or more.

The first metal layer 620 is configured to provide the first ground signal 690 and the second ground signal 692. The first ground signal 690 and the second ground signal 692 may be from the same ground source or from different ground sources. Regardless, the first ground signal and the second ground signal are at substantially the same ground potential. Accordingly, because the first terminal 604 is coupled to a first ground signal 690 (through the first metal layer 620) and the second terminal 606 is coupled to a second ground signal 692 (through the first metal layer 620), the first passive component is shorted.

In an example, the first metal layer 620 is a grounded conductive plane and the first ground signal 690 and the second ground signal 692 are at the same potential ground. That is, the first ground signal 690 and the second ground signal 692 are from the same ground source. In another example, the first metal layer 620 may comprise various conductive points that are grounded, i.e., having a first ground signal 690 and a second ground signal 692. That is, the first ground signal 690 and the second ground signal 692 are from different ground sources. Regardless, the first ground signal and the second ground signal are at substantially the same ground potential. Therefore, the first terminal 604 and the second terminal 606 are coupled respectively to the first ground signal 690 and the second ground signal 692 such that the first passive component is shorted.

FIG. 6C illustrates a top view of the packaged surface mount passive component 600. Specifically, FIG. 6C illustrates the first passive component 602 including the first terminal 604 and the second terminal 606 mounted to the first metal layer 620 of the substrate 640. In one example, there is an opening 620a in the first metal layer 620, where the second metal layer 622 can be seen. The first metal layer 620 is configured to provide the first ground signal 690 and the second ground signal 692. The first ground signal 690 and the second ground signal 692 may be the same (e.g., from the same ground source) or they may be two separate signals (e.g., from different ground sources). Because both the first terminal 604 and the second terminal 606 are mounted and electrically coupled to the first metal layer 620 that is grounded, the first terminal 604 and the second terminal 606 are shorted together (i.e., the first passive component 602 is shorted together to ground).

Although FIG. 6A-6C illustrate the first passive component 602 on the first metal layer 620 (where FIG. 6A-C illustrate the first metal layer 620 as being on an outer metal layer of the substrate 640), and with the first ground signal 690 and the second ground signal 692 located on the first metal layer 620, this is exemplary.

The first passive component 602 may be located on any of the plurality of metal layers 618 of the substrate 640.

In one example, the first passive component 602 may be located on an outer metal layer of the plurality of metal layers 618. FIG. 6A illustrates one instance where the first passive component 602 is located on an outer metal layer (e.g., the first metal layer 620). In another illustration, the first passive component 602 could be located on the sixth metal layer 630.

In another example, the first passive component 602 may be located on an inner metal layer of the substrate 640, such that the first passive component 602 is embedded inside the substrate 640. (See second passive component 702b in FIG. 7A which will be discussed later). An inner metal layer of substrate 640 may include any of the plurality of metal layers shown in FIG. 6A that are not the outer metal layer of the plurality of metal layers. In FIG. 6A, the second metal layer 622, the third metal layer 624, the fourth metal layer 626, the fifth metal layer 628 are all inner layers, whereas the first metal layer 620 and the sixth metal layers 630 are outer metal layers of the plurality of metal layers 618. When the first passive component 602 is located on an inner metal layer of the substrate 640 (e.g., second metal layer 622— fifth metal layer 628), the first passive component 602 is embedded in the substrate 602.

In yet another example, the first passive component 602 may be considered to be embedded in the substrate 640, even though the first passive component 602 is on an outer metal layer of the substrate 640. To illustrate, the first passive component 602 could be mounted on the first metal layer 620, where the first metal layer 620 includes a first surface facing upwards and a second surface facing downwards. In this illustration, the first passive component 602 is embedded in the substrate 602 when it is mounted on the second surface of the first metal layer 620, such that the first passive component 602 is facing downwards towards the other inner metal layers of the plurality of metal layers 618 of the substrate 640.

Furthermore, the first ground signal 690 and the second ground signal 692 need not be located on the same metal layer of the plurality of metal layers as that which the first passive device 602 is mounted on. In other words, the first passive component 602 may be mounted on one metal layer of the plurality of metal layers 618 (e.g., one of the first metal layer 620—sixth metal layer 630). Whereas a different metal layer of the plurality of metal layers 618 be configured to provide the first ground signal 690 and/or the second ground signal 692. In this example, a plurality of vias (not shown) can be used to couple each one of the first terminal 604 and the second terminal 606 to its respective first ground signal 690 and second ground signal 692 on its respective metal layer.

The first passive component 602 of FIG. 6A-C may be any one of the following: an inductor, a capacitor, or a resistor. For example, first passive component 602 may be any of inductor, a capacitor, or a resistor as illustrated in FIGS. 3A-B, 4A-B, and 5A-B respectively.

Figure 7A:
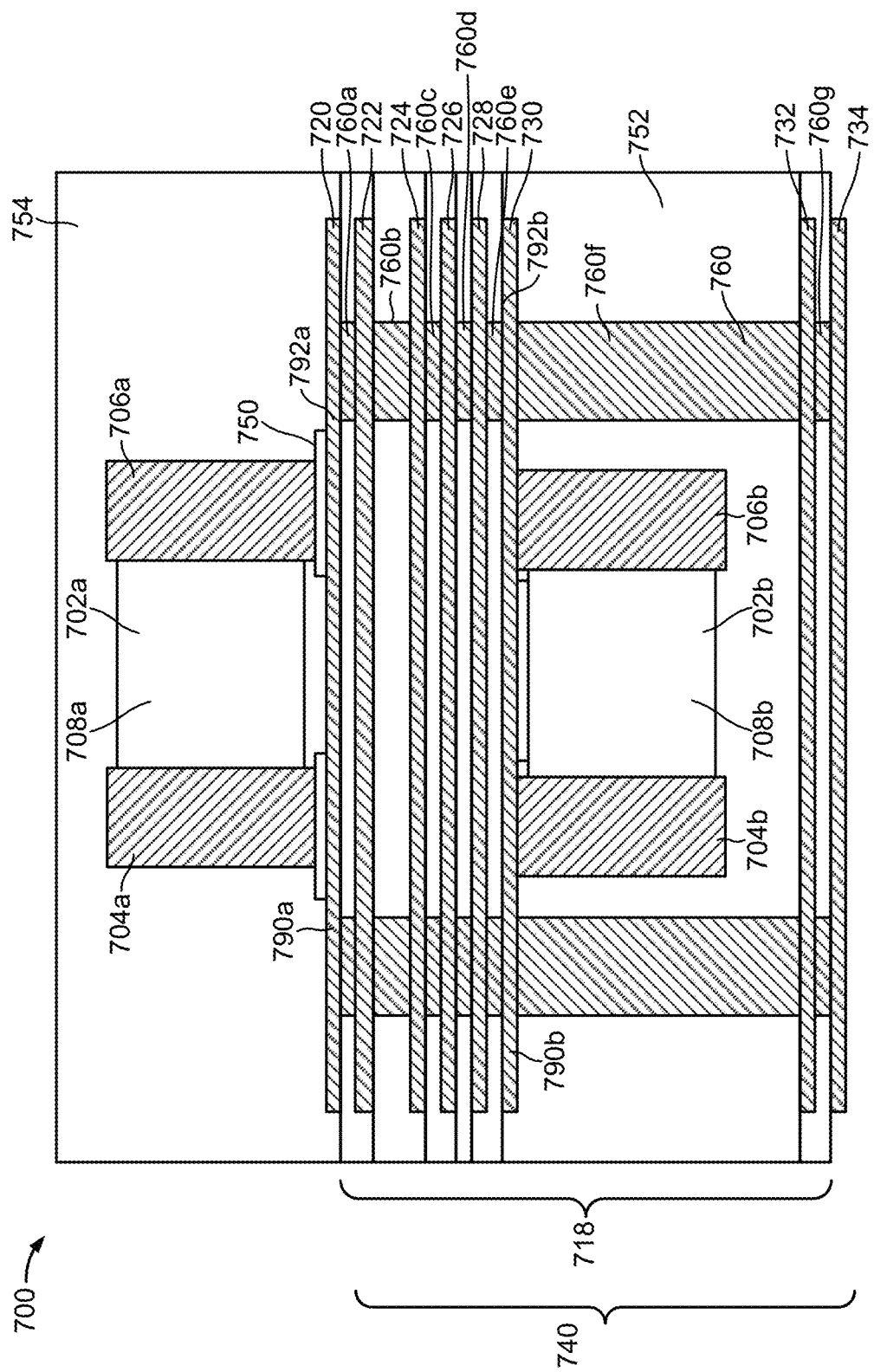
FIGS. 7A and 7B illustrate different views of another exemplary packaged surface mount passive component that is shorted.
Figure 7B:
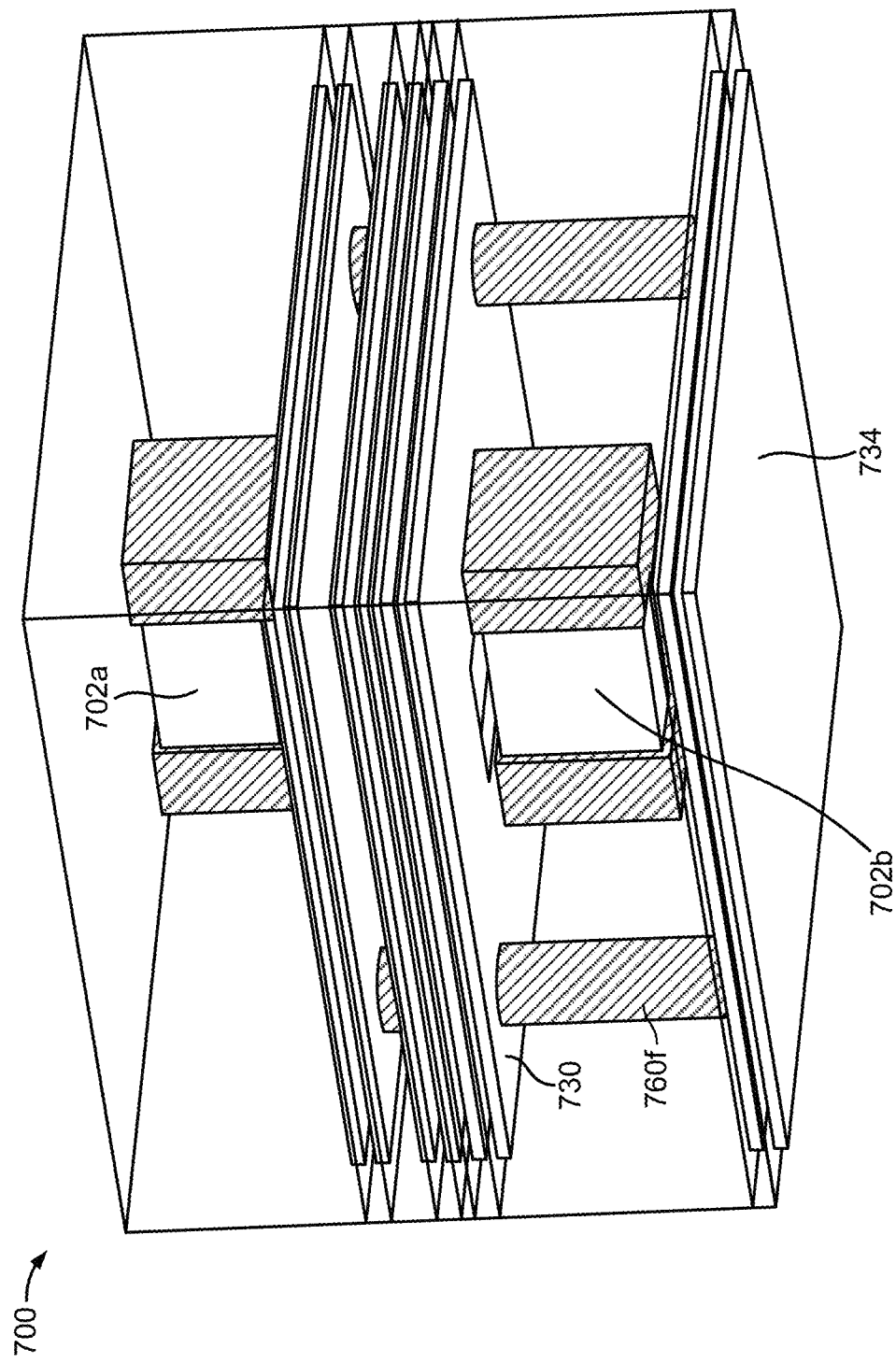

FIGS. 7A and 7B illustrate different views of another exemplary packaged surface mount passive component (e.g., device) that is shorted. FIG. 7A illustrates a cross section (two dimensional) view of a packaged surface mount passive component 700 and FIG. 7B illustrates a three dimensional view of the packaged surface mount passive component 700. Specifically, FIGS. 7A and 7B illustrate the packaged device 700 including a first passive component 702a and a second passive component 702b mounted to a substrate 740.

The substrate 740 may be a package substrate, a printed circuit board (PCB), an interposer, a laminate or organic substrate, a wafer level package or a chip scale package, or any other type of carrier. The substrate 740 includes a plurality of metal layers 718 such as a first metal layer 720, a second metal layer 722, a third metal layer 724, a fourth metal layer 726, a fifth metal layer 728, a sixth metal layer 730, a seventh metal layer 732, and an eighth metal layer 734. Although the substrate 740 is illustrated as having eight metal layers (i.e., first metal layer 720 through eighth metal layer 734), this is only an example. The substrate 740 may have less metal layers, such as three or four or five metal layers, or it may have more than six metal layers, such as seven metal layers, eight metal layers, nine metal layers, etc. The first metal layer is configured to provide a first ground signal 790a and a second ground signal 792a. The sixth metal layer 730 is configured to provide a third ground signal 790b and a fourth ground signal 792b.

The substrate 740 has a plurality of dielectric layers 752 as illustrated in FIG. 7A that alternate between each of the plurality of metal layers 718 (i.e., first metal layer 720 through eighth metal layer 734) so as to provide isolation between each of the plurality of metal layers 718. Optionally, the first passive component 702a (e.g., top passive component 702a) may be surrounded by a mold 754 for electrical isolation and/or for mechanical support.

The substrate 740 includes a plurality of vias 760 configured to vertically traverse the plurality of metal layers 718. The plurality of vias 760 are configured to electrically couple the plurality of metal layers 718 together. The plurality of vias 760 include a first via 760a (or a set of first vias 760a) configured to couple the first metal layer 720 to the second metal layer 722, a second via 760b (or a set of second vias 760b) configured to couple the second metal layer 722 to the third metal layer 724, a third via 760c (or a set of third vias 760c) configured to couple the third metal layer 724 to the fourth metal layer 726, a fourth via 760d (or a set of fourth vias 760d) configured to couple the fourth metal layer 726 to the fifth metal layer 728, a fifth via 760e (or a set of fifth vias 760e) configured to couple the fifth metal layer 728 to the sixth metal layer 730, a sixth via 760f (or a set of sixth vias 760f) configured to couple the sixth metal layer 730 to the seventh metal layer 732, a seventh via 760g (or a set of seventh vias 760g) configured to couple the seventh metal layer 732 to the eight metal layer 734.

Furthermore, as will be discussed later with respect to FIG. 10, when a first terminal and/or a second terminal (e.g., 1004 and 1006 respectively) are coupled to one of the plurality of vias 760, the plurality of vias 760 may couple the first terminal and/or the second terminal to the one of the plurality of metal layers 718 where a ground is located. That is, the plurality of vias 760 allow for the first terminal and/or second terminal to be coupled to a ground signal that is not co-located on the same metal layer of the plurality of metal layers 718 as the first terminal and/or second terminal.

FIGS. 7A and 7B further illustrate a first passive component 702a. The first passive component 702a may be an inductor, a capacitor, or a resistor. For example, the first passive component 702a may be like the first passive component 302 that is an inductor (e.g., FIG. 3A,3B), like the first passive component 402 that is a capacitor (e.g., FIG. 4A, 4B), or like the first passive component 502 that is a resistor (e.g., FIG. 5A, 5B). Similar to the first passive components 302, 402, and 502, the first passive component 702a is shorted.

The first passive component 702a includes a first terminal 704a, a second terminal 706a, and a first body 708a mounted to the substrate 740 on one of the plurality of metal layers 718 (e.g., first metal layer 720 through eighth metal layer 734). Specifically, FIGS. 7A and 7B illustrate the first passive component 702a, including the first terminal 704a and the second terminal 706a, mounted to the first metal layer 720. The first passive component 702a may be coupled to the first metal layer 720 through an interconnect 750 such as a pad, a solder pad or the like.

The first metal layer 720 is configured to provide the first ground signal 790a and the second ground signal 792a. Accordingly, because the first terminal 704 is coupled to a first ground signal 790 (through the first metal layer 720) and the second terminal 706 is coupled to a second ground signal 792 (through the first metal layer 720), the first passive component 702 is shorted.

FIGS. 7A and 7B further illustrate the second passive component 702b. The second passive component 702b may be an inductor, a capacitor, or a resistor (e.g., see FIG. 3A-5B). For example, the second passive component 702b may be like the first passive component 302 that is an inductor, like the first passive component 402 that is a capacitor, or like the first passive component 502 that is a resistor. Similar to the first passive component 302, 402, and 502, the second passive component 702b is shorted.

The second passive component 702b includes a first terminal 704b, a second terminal 706b, and a first body 708b mounted to the substrate 740 on one of the plurality of metal layers 718 (e.g., first metal layer 720 through eighth metal layer 734). Specifically, FIGS. 7A and 7B illustrate the second passive component 702b, including the first terminal 704b and the second terminal 706b, mounted to the sixth metal layer 730.

The sixth metal layer 730 is configured to provide the third ground signal 790b and the fourth ground signal 792b. Accordingly, because the first terminal 704b is coupled to a third ground signal 790b (through the sixth metal layer 730) and the second terminal 706b is coupled to the fourth ground signal 792b (through the first metal layer 720), the second passive component 702b is shorted.

In the examples of FIGS. 7A and 7B, the first passive component 702a is mounted on the first metal layer 720 which is an outer metal layer (e.g., the first metal layer 720 and the eight metal layer 734 are both outer metal layers of the substrate 740). The first component 702a is mounted to a first surface of the first metal layer 720, where the first surface faces upwards (i.e., an upward facing surface of the plurality of metal layers 718).

Furthermore, the second passive component 702b is mounted to on the sixth metal layer 730 which is an inner metal layer of the substrate 740, such that the second passive component 702b is embedded inside the substrate. An inner metal layer of substrate 740 may include any of the plurality of metal layers 718 shown in FIGS. 7A and 7B that are not the outer metal layer of the plurality of metal layers 718. In FIGS. 7A and 7B, the second metal layer 722, the third metal layer 724, the fourth metal layer 726, the fifth metal layer 728, the sixth metal layer 730, and the seventh metal layer 732 are all inner layers, whereas the first metal layer 320 and the sixth metal layers 330 are outer metal layers. The second passive component 702b is mounted to a second surface of the sixth metal layer 730, where the second surface faces downwards (i.e., a downward facing surface of the plurality of metal layers 718).

FIGS. 7A and 7B are exemplary and the first passive component 702A and the second passive component 702B may be located on any of the plurality of metal layers 718 including on a surface of the plurality of metal layers 718 that faces upwards or a surface of the plurality of metal layers 718 that faces downwards. Furthermore, there may be one first passive component (e.g., see FIG. 7A) or there may be a plurality of passive components.

In an example, the first metal layer 720 is a ground plane and the first ground signal 790a and the second ground signal 792a are the same and are from the same ground source. In another example, the first metal layer 720 may comprise multiple ground points (e.g., first ground signal 790a or 790b and a second ground signal 792a or 792b). In this example, the first ground signal 790a of the first metal layer 720 may be distinct and separate from the second ground signal 792a of the first metal layer 720. In other words, the first ground signal 790a may be from a different ground source than the second ground signal 792a. Regardless of the ground source, the first ground signal 790a and the second ground signal 792a are at substantially the same ground potential. Because the first terminal 704a and the second terminal 706a are coupled respectively to the first ground signal 790a and the second ground signal 792a at substantially the same ground potential, the first passive component 702a is shorted.

Furthermore, the above concepts are applied to the sixth metal layer 730. The sixth metal layer 730 is configured to provide a third ground signal 790b and a fourth ground signal 792b. Regardless of whether the sixth metal layer 730 is a ground plane or whether the third ground signal 790b and the fourth ground signal 792b come from the same ground source or different ground sources, the second passive component 702b is shorted together.

Figure 8A:
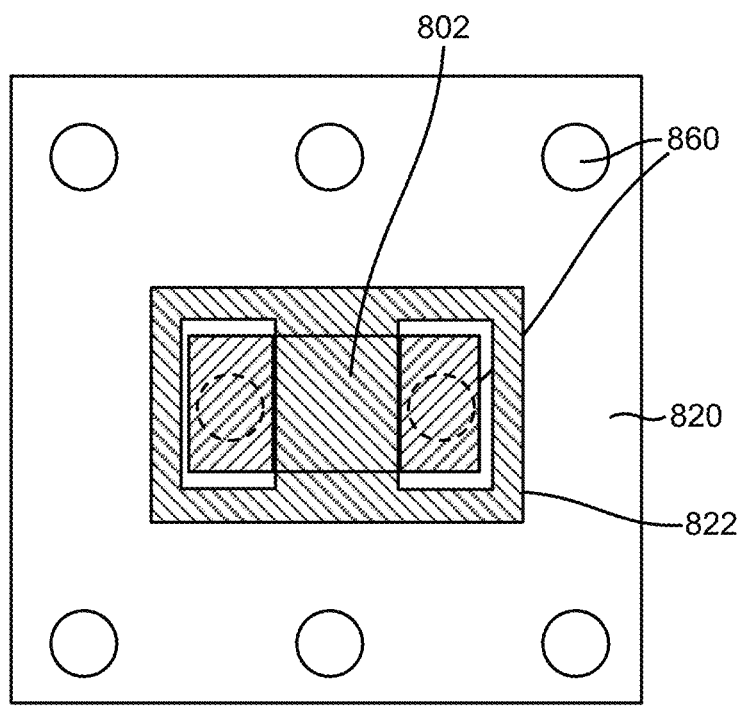
FIGS. 8A, 8B, and 8C illustrate different views of another exemplary packaged surface mount passive component that is shorted.
Figure 8B:
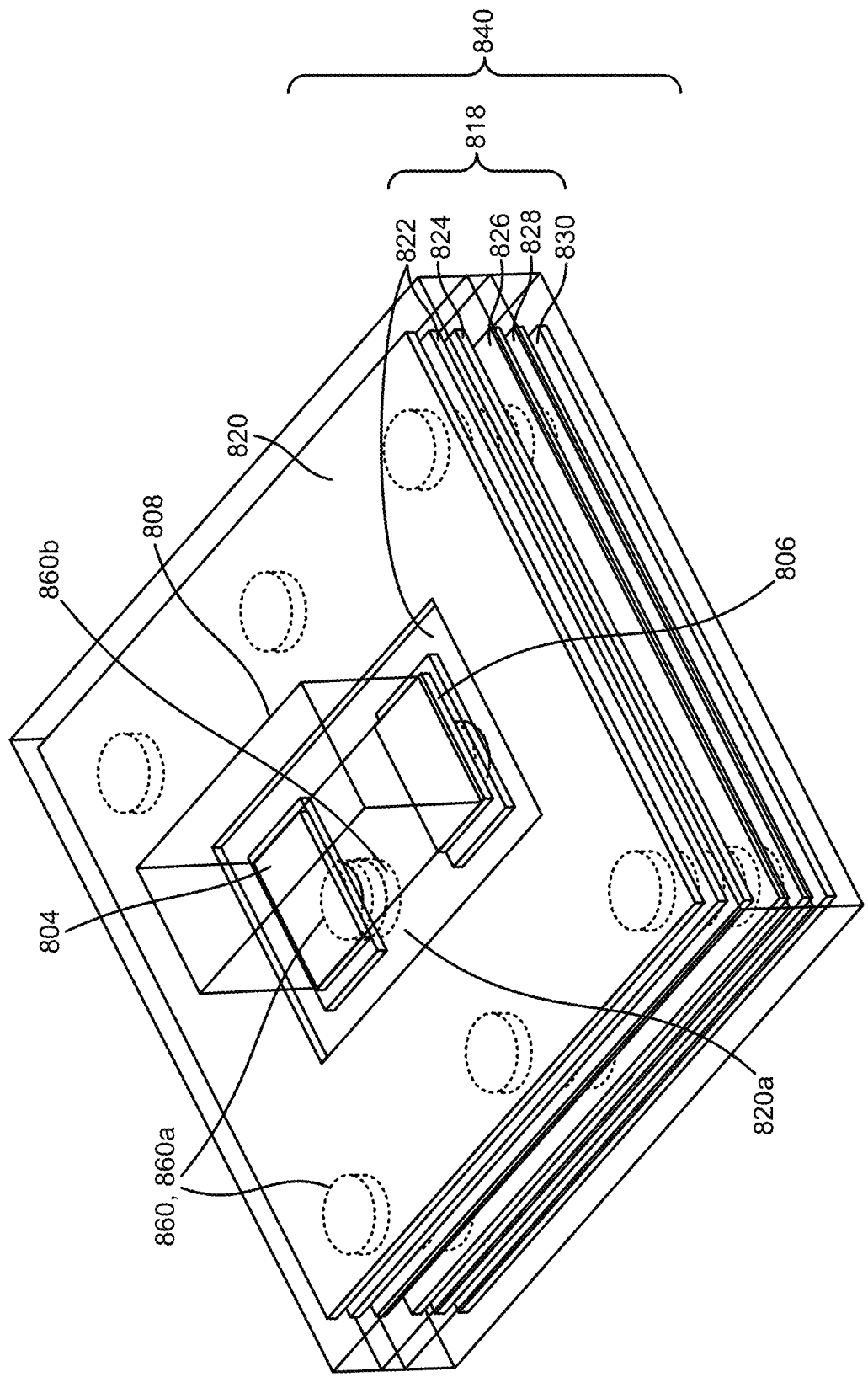
Figure 8C:
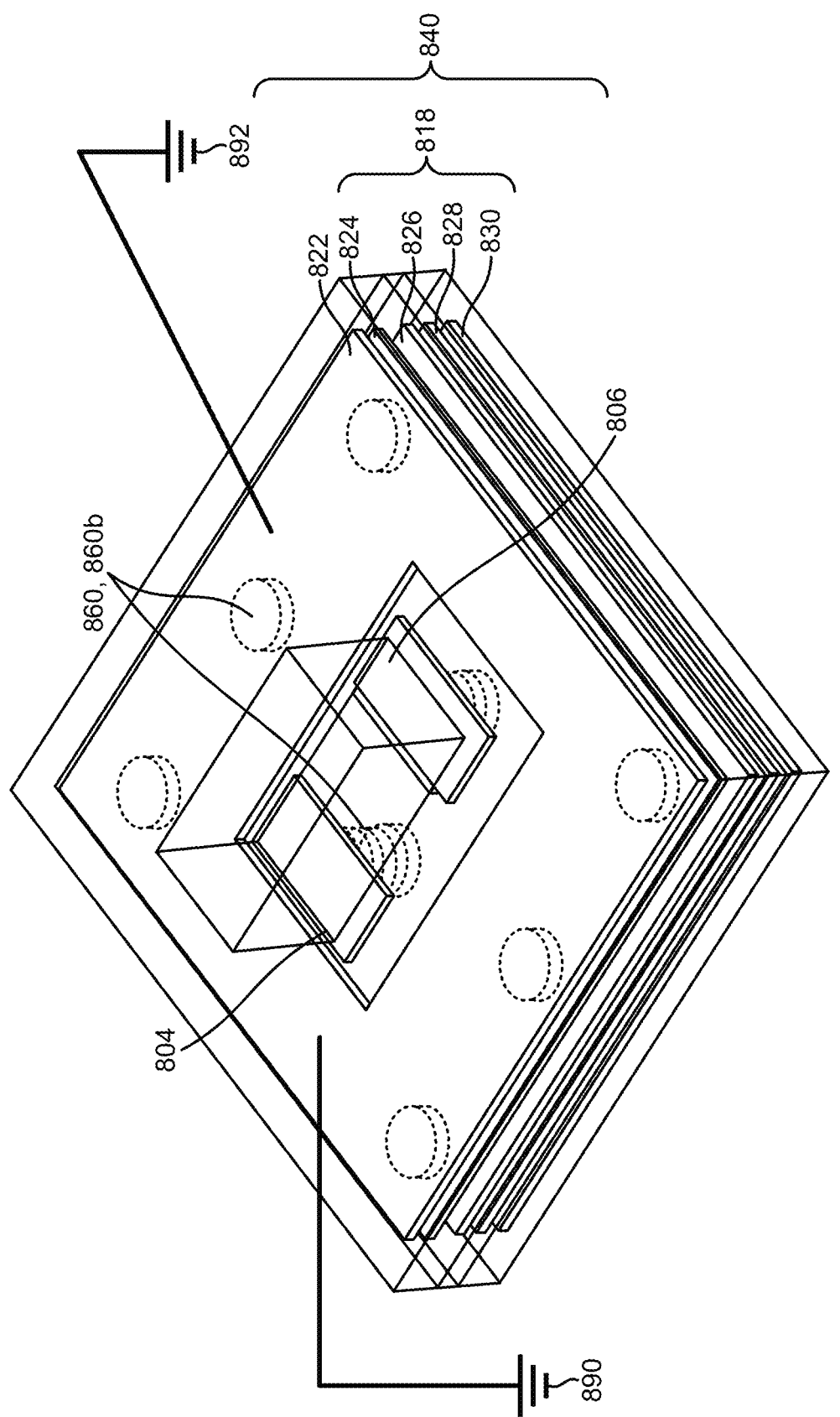

FIGS. 8A, 8B, and 8C illustrate different views of another exemplary packaged surface mount passive component (e.g., device) that is shorted. FIGS. 8A, 8B, and 8C illustrate a packaged surface mount passive component 800 including a first passive component mounted on a one of the plurality of metal layers and shorted through a another one of the plurality metal layers configured to provide a first ground signal and a second ground signal. FIG. 8A illustrates a top view of the packaged surface mount passive component 800 including a first passive component 802. FIG. 8B illustrates a three dimensional view of the packaged surface mount passive component 800 including the first passive component 802. FIG. 8C illustrates another three dimensional view of the packaged surface mount passive component 800, except in this view, for simplicity, the top most metal layer (i.e., the first metal layer 820) is removed as will be discussed later.

FIGS. 8A and 8B illustrate a substrate 840. The substrate 840 may be a package substrate, a printed circuit board (PCB), an interposer, a laminate or organic substrate, a wafer level package or a chip scale package, or any other type of carrier. The substrate 840 includes a plurality of metal layers 818 including a first metal layer 820, a second metal layer 822, a third metal layer 824, a fourth metal layer 826, a fifth metal layer 828, and a sixth metal layer 830. Although the substrate 840 is illustrated as having six metal layers (i.e., first metal layer 820 through sixth metal layer 830), this is only an example. The substrate 840 may have less metal layers, such as three or four or five metal layers, or it may have more than six metal layers, such as seven metal layers, eight metal layers, nine metal layers, etc.

One or more of the metal layers of the plurality of metal layers 818 may be grounded, i.e., coupled to a ground source. The one or more metal layers of the plurality of metal layers 818 may be a ground plane (where the one or more metal layer is substantially grounded) or may have a ground point or ground area wherein a portion of the one or more metal layers is grounded. Specifically, FIG. 8B illustrates the second metal layer 822 as being grounded. In this example, the second metal layer 822 is configured to provide a first ground signal 890 and a second ground signal 892.

The substrate 840 has a plurality of dielectric layers (not shown here but as illustrated in FIG. 3B) that alternate between each of the plurality metal layers 818 (i.e., first metal layer 820 through sixth metal layer 830) so as to provide isolation between each of the plurality of metal layers 818.

FIGS. 8A and 8B illustrate a plurality of vias 860 configured to electrically couple the plurality of metal layers 818 together (e.g., the plurality of vias 860 may couple at least a first metal layer 820 to a second metal layer 822). The plurality of vias 860 includes a set of first vias 860a (see FIG. 8B) configured to electrically couple the first metal layer 820 to the second metal layer 822. The plurality of vias 860 may include a set of second vias 860b (see FIGS. 8B and 8C) configured to electrically couple the second metal layer 822 to the third metal layer 824. Although not illustrated for the purpose of clarity of other features, there may also be a set of third vias 860c configured to electrically couple the third metal layer 824 to the fourth metal layer 826, a set of fourth vias 860d configured to electrically couple the fourth metal layer 826 to the fifth metal layer 828, and a set of fifth vias 860e configured to electrically couple the fifth metal layer 828 to the sixth metal layer 830. Furthermore, as illustrated in 8C, the plurality of vias 860 are configured to vertically traverse the substrate 840 including the plurality of dielectric layers (not shown in FIG. 8A, 8B, or 8C, but illustrated in FIG. 7A). The term "set" as used in this paragraph refers to two or more (however does not require pairs of two).

In the exemplary embodiment of FIGS. 8A, 8B, and 8C, the first passive component 802 is not co-located on the same metal layer as the metal layer that is configured to provide the first ground signal 890 and/or the second ground signal 892. Specifically, the first passive component 802 is mounted to the first metal layer 820, whereas the second metal layer 822 is configured to provide the first ground signal 890 and the second ground signal 892. In this example, the plurality of vias 860 allow for the first passive component 802 to be coupled to the ground signal (e.g., first ground signal 890, and/or second ground signal 892), when the first passive component 802 is not co-located on the same metal layer as the metal layer that is configured to provide the first ground signal 890 and/or the second ground signal 892.

FIGS. 8A, 8B and 8C further illustrate a first passive component 802. The first passive component 802 may be an inductor (e.g., FIG. 3A, 3B), a capacitor (e.g., FIG. 4A, 4B), or a resistor (e.g., FIG. 5A, 5B). The first passive component 802 includes a first terminal 804, a second terminal 806, and a first body 808 mounted to the substrate 840 on one of the plurality of metal layers 818 (e.g., first metal layer 820 through sixth metal layer 830). Specifically, FIGS. 8A and 8B illustrate the first passive component 802, including the first terminal 804 and the second terminal 806, mounted on the first metal layer 820.

The first terminal 804 and the second terminal 806 are coupled to the set of first vias 860a of the plurality of vias 860. The set of first vias 860a are located on the first metal layer 820. The set of first vias 860a couple the first terminal 804 and the second terminal 806 on the first metal layer 820 to the second metal layer 822 of the plurality of metal layers 818. The second metal layer 822 is configured to provide the first ground signal 890 to the first terminal 804. Further, the second metal layer 822 is configured to provide the second ground signal 892 to the second terminal 806 such that the first passive component 802 is shorted. That is, the plurality of vias 860 allow for the first terminal 804 and/or second terminal 806 to be coupled to a ground signal (e.g., 890 or 892) that is not co-located on the same metal layer of the plurality of metal layers 818 as the first terminal 804 and/or second terminal 806. Because the first terminal 804 and the second terminal 804 are coupled to ground signals (by way of the first ground signal 890 and the second ground signal 892 respectively), the first passive component 802 is shorted.

FIG. 8C illustrates the packaged surface mount passive component 800 of FIGS. 8A and 8B, except that for clarity, the first metal layer 820 is removed. FIG. 8C illustrates that although the first passive component 802 is located on the first metal layer 820, the first passive component 802 is coupled to the second metal layer 822 through the set of first vias 860a. The second metal layer 822 is configured to provide the first ground signal 890 and the second ground signal 892.

In the example of FIGS. 8A, 8B and 8C, the second metal layer 822 is a ground plane and therefore the second metal layer 822 is at the same ground potential (or a substantial part of the second metal layer 822 is at the same ground potential). That is, the first ground signal 890 and the second ground signal 892 are at the same or substantially the same ground potential. Therefore, the first terminal 804 and the second terminal 806 are shorted together.

In another example, the first ground signal 890 of the second metal layer 822 may be distinct and separate from the second ground signal 892 of the second metal layer 822. In other words, the first ground signal 890 may be from a different ground source than the second ground signal 892. Regardless of the ground source, the first ground signal 890 and the second ground signal 892 are at substantially the same ground potential. The first terminal 804 and the second terminal 806 are respectively coupled to the first ground signal 890 and the second ground signal 892, such that the first passive component is shorted.

Figure 9:
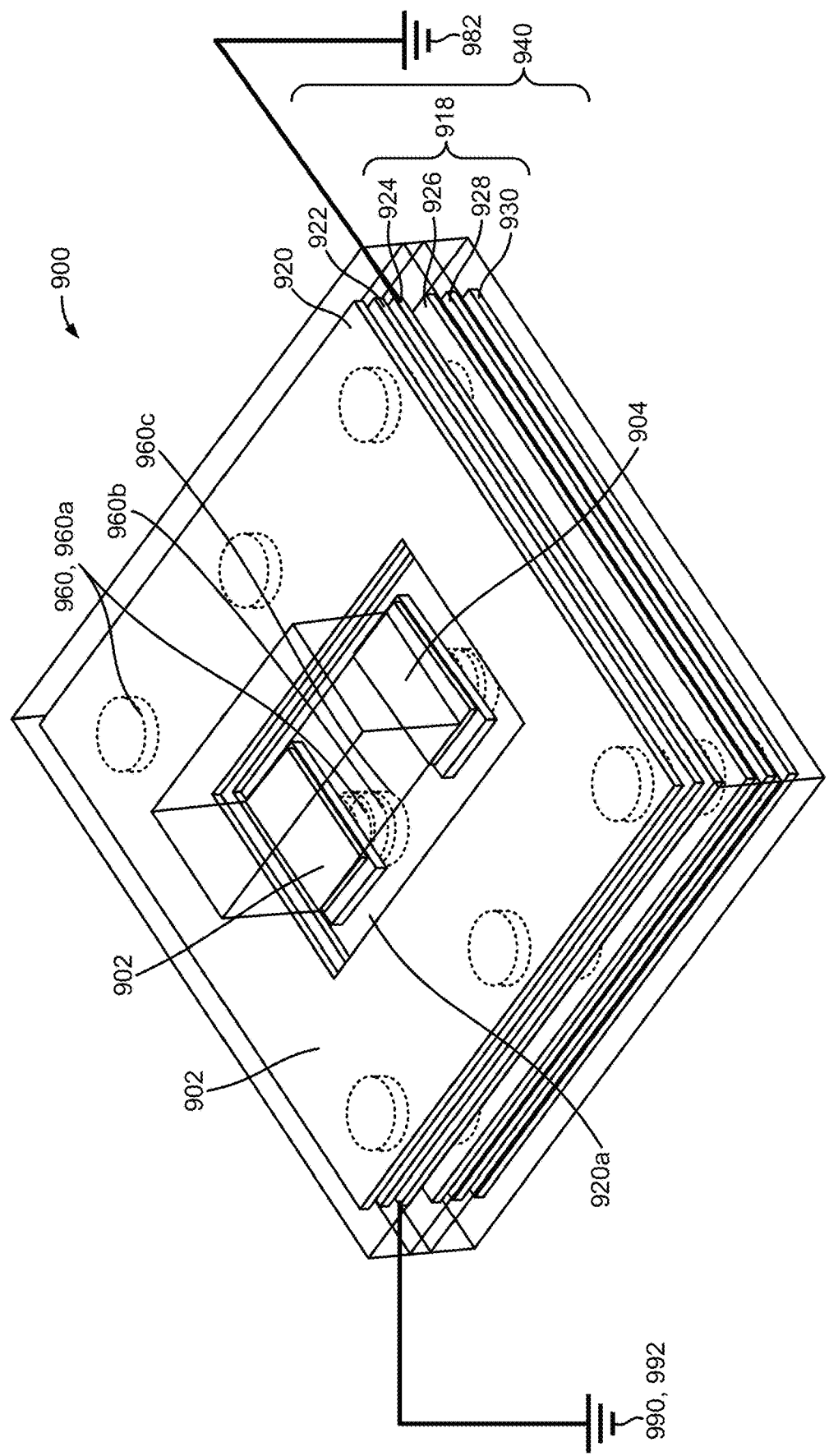
FIG. 9 illustrates another exemplary packaged surface mount passive component that is shorted.

FIG. 9 illustrates different views of another exemplary packaged surface mount passive component (e.g., device) that is shorted. FIG. 9 illustrates a packaged surface mount passive component 900 similar to that of FIGS. 8A, 8B, and 8C, except the passive component is grounded through the third metal layer.

FIG. 9 illustrates a substrate 940. The substrate 940 may be a package substrate, a printed circuit board (PCB), an interposer, a laminate or organic substrate, a wafer level package or a chip scale package, or any other type of carrier. The substrate 940 includes a plurality of metal layers 918 such as a first metal layer 920, a second metal layer 922, a third metal layer 924, a fourth metal layer 926, a fifth metal layer 928, and a sixth metal layer 930. An opening 920a in the plurality of metal layers 918 is illustrated. Although the substrate 940 is illustrated as having six metal layers (i.e., first metal layer 920 through sixth metal layer 930), this is only an example. The substrate 940 may have less metal layers, such as three or four or five metal layers, or it may have more than six metal layers, such as seven metal layers, eight metal layers, nine metal layers, etc.

One or more of the metal layers of the plurality of metal layers 918 may be grounded, i.e., coupled to a ground source. The one or more metal layers of the plurality of metal layers 918 may be a ground plane (where a substantial part of the metal is grounded to the same ground source) or may have a ground point or ground area wherein a portion of the one or more metal layers is grounded. Specifically, FIG. 9 illustrates the third metal layer 924 as being grounded. In this example, the third metal layer 924 is configured to supply both a first ground signal 990 and a second ground signal 992.

The substrate 940 has a plurality of dielectric layers (not shown here but as illustrated in FIG. 3B) that alternate between each of the plurality of metal layers 918 (i.e., first metal layer 920 through sixth metal layer 930) so as to provide isolation between each of the plurality of metal layers 918.

FIG. 9 illustrate a plurality of vias 960 configured to electrically couple the plurality of metal layers 918 together (e.g., the plurality of vias 960 may couple at least a first metal layer 920 to a second metal layer 922 and a second metal layer 922 to the third metal layer 923). Furthermore, the plurality of vias 960 are configured to vertically traverse the plurality of metal layers 918 and the dielectric layers (not shown), so that the plurality of metal layers 918 are electrically coupled together. The plurality of vias 960 include a set of first vias 960a configured to electrically couple the first metal layer 920 to the second metal layer 922. The plurality of vias 960 include a set of second vias 960b configured to electrically couple the second metal layer 922 to the third metal layer 924. There may also be a set of third vias 960c configured to electrically couple the third metal layer 924 to the fourth metal layer 926, and although not illustrated for the purpose of clarity of other features, a set of fourth vias 960d configured to electrically couple the fourth metal layer 926 to the fifth metal layer 929, and a set of fifth vias 960e configured to electrically couple the fifth metal layer 929 to the sixth metal layer 930 may also be included. Furthermore, the plurality of vias 960 are configured to vertically traverse the substrate 940 including the plurality of dielectric layers (not shown in FIG. 9, but illustrated in FIG. 7A). The term "set" as used in this paragraph refers to two or more (however does not require pairs of two).

In the exemplary embodiment of FIG. 9, the first passive component 902 is not co-located on the same metal layer as the metal layer that is configured to provide the first ground signal 990 and/or the second ground signal 992. Specifically, the first passive component 902 is mounted to the first metal layer 920, whereas the third metal layer 924 is configured to provide the first ground signal 990 and the second ground signal 992. In this example, the plurality of vias 960 allow for the first passive component 902 to be coupled to the ground signal (e.g., first ground signal 990, and/or second ground signal 992), when the first passive component 902 is not co-located on the same metal layer as the metal layer that is configured to provide the first ground signal 990 and/or the second ground signal 992.

FIG. 9 further illustrates a first passive component 902. The first passive component 902 may be an inductor (e.g., FIG. 3A, 3B), a capacitor (e.g., FIG. 4A, 4B), or a resistor (e.g., FIG. 5A, 5B). The first passive component 902 includes a first terminal 904, a second terminal 906, and a first body 909 mounted to the substrate 940 on one of the plurality of metal layers 918 (e.g., first metal layer 920 through sixth metal layer 930). Specifically, FIG. 9 illustrates the first passive component 902, including the first terminal 904 and the second terminal 906, mounted on the first metal layer 920.

The first terminal 904 is on the first metal layer 920 and electrically coupled to a one of the set of first vias 960a, the one of the set of first vias 960a is electrically coupled to a one of the set of second vias 960b, where the one of the set of second vias 960b is coupled to the third metal layer 924. Accordingly, the first terminal 904 located on the first metal layer 920 is electrically coupled to the third metal layer 924. The second terminal 906 is on the first metal layer 920 and electrically coupled to another one of the set of first vias 960a, the another one of the set of first vias 960a is electrically coupled to another one of the set of second vias 960b, where the another one of the set of second vias 960b is coupled to the third metal layer 924. Accordingly, the second terminal 906 located on the first metal layer 920 is electrically coupled to the third metal layer 924. The third metal layer 924 is configured to provide the first ground signal 990 to the first terminal 904. Further, the third metal layer is configured to provide the second ground signal 992 to the second terminal 904, such that the passive component 902 is shorted. That is, the plurality of vias 960 allow for the first terminal and/or second terminal to be coupled to a ground signal (e.g., 990 or 992) that is not co-located on the same metal layer of the plurality of metal layers 918 as the first terminal 904 and/or second terminal 906.

In an example, the third metal layer 924 is a ground plane and therefore at the same ground potential or substantially the same ground potential. In this example, the first ground signal 990 and the second ground signal 992 are from the same ground source. In another example, the first ground signal 990 of the second metal layer 922 may be distinct and separate from the second ground signal 992 of the third metal layer 924. In other words, the first ground signal 990 may be from a different ground source than the second ground signal 992. Regardless of the ground source, the first ground signal and the second ground signal are at substantially the same ground potential. The first terminal 904 and the second terminal 906 are coupled respectively to the first ground signal 990 and the second ground signal 992 such that the first passive component 902 is shorted.

Figure 10:
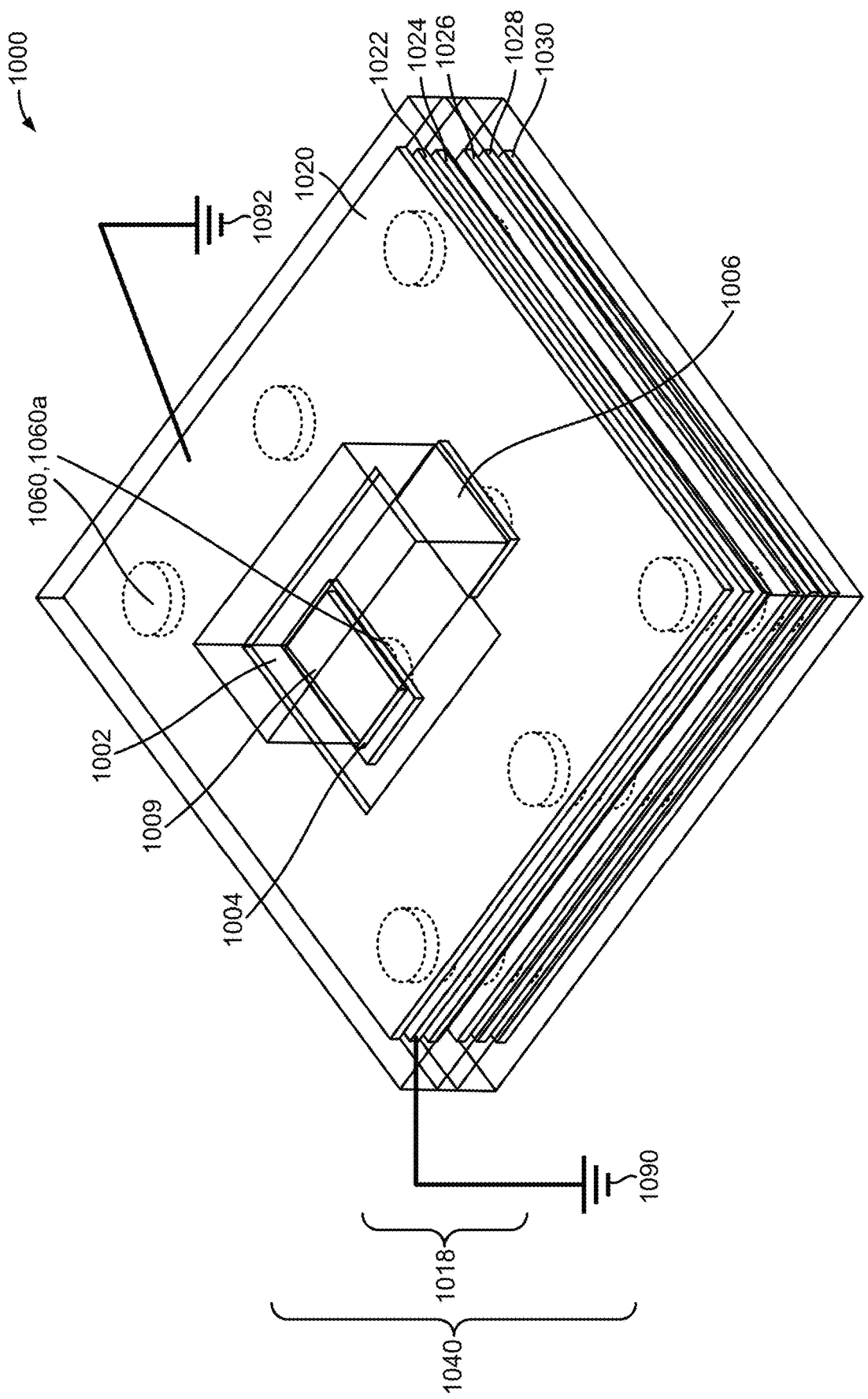
FIG. 10 illustrates another exemplary packaged surface mount passive component that is shorted.

FIG. 10 illustrates another exemplary packaged surface mount passive component (e.g., device) that is shorted. FIG. 10 illustrates a packaged surface mount passive component 1000 similar to that of FIGS. 8A, 8B, and 8C, except that a one terminal of the passive component is grounded through a second metal layer, and another terminal of the passive component is grounded through the first metal layer.

The first passive component 1002 may be an inductor (e.g., FIG. 3A, 3B), a capacitor (e.g., FIG. 4A, 4B), or a resistor (e.g., FIG. 5A, 5B). The first passive component 1002 includes a first terminal 1004, a second terminal 1006, and a first body 1009 mounted to a substrate 1040 on one of the plurality of metal layers 1018 (e.g., first metal layer 1020 through sixth metal layer 1030).

FIG. 10 illustrates a substrate 1040. The substrate 1040 may be a package substrate, a printed circuit board (PCB), an interposer, a laminate or organic substrate, a wafer level package or a chip scale package, or any other type of carrier. The substrate 1040 includes a plurality of metal layers 1018 such as a first metal layer 1020, a second metal layer 1022, a third metal layer 1024, a fourth metal layer 1026, a fifth metal layer 1028, and a sixth metal layer 1030. Although the substrate 1040 is illustrated as having six metal layers (i.e., first metal layer 1020 through sixth metal layer 1030), this is only an example. The substrate 1040 may have less metal layers, such as three or four or five metal layers, or it may have more than six metal layers, such as seven metal layers, eight metal layers, nine metal layers, etc.

One or more of the metal layers of the plurality of metal layers 1018 may be grounded, i.e., coupled to a ground source. The one or more metal layers of the plurality of metal layers 1018 may be a ground plane (where a substantial portion of the metal layer is grounded) or may have a ground point or ground area wherein a portion of the one or more metal layers is grounded. Specifically, FIG. 10 illustrates the second metal layer 1022 as being grounded. The second metal layer 1022 is configured to supply a first ground signal 1090. FIG. 10 also illustrates the first metal layer 1020 as being grounded. The first metal layer 1020 is configured to supply both a second ground signal 1092.

The substrate 1040 has a plurality of dielectric layers (not shown here but as illustrated in FIG. 3B) that alternate between each of the plurality of metal layers 1018 (i.e., first metal layer 1020 through sixth metal layer 1030) so as to provide isolation between each of the plurality of metal layers 1018.

FIG. 10 illustrate a plurality of vias 1060 configured to electrically couple the plurality of metal layers 1018 together (e.g., the plurality of vias 1060 may couple at least a first metal layer 1020 to a second metal layer 1022). Furthermore, the plurality of vias 1060 are configured to vertically traverse the plurality of metal layers 1018 and the dielectric layers (not shown), so that the plurality of metal layers 1018 are electrically coupled together. The plurality of vias 1060 may include a set of first vias 1060a configured to electrically couple the first metal layer 1020 to the second metal layer 1022. The plurality of vias 1060 may include a set of second vias 1060b configured to electrically couple the second metal layer 1022 to the third metal layer 1024. Although not illustrated for the purpose of clarity of other features, there may also be a set of third vias 1060c configured to electrically couple the third metal layer 1024 to the fourth metal layer 1026, a set of fourth vias 1060d configured to electrically couple the fourth metal layer 1026 to the fifth metal layer 1029, and a set of fifth vias 1060e configured to electrically couple the fifth metal layer 1029 to the sixth metal layer 1030. Furthermore, as illustrated in FIGS. 7A, 7B, and 10, the plurality of vias 1060 are configured to vertically traverse the substrate 1040 including the plurality of dielectric layers (not shown in FIG. 10, but illustrated in FIG. 7A). The term "set" as used in this paragraph refers to two or more (however does not require pairs of two).

In the exemplary embodiment of FIG. 10, the first terminal 1004 of the first passive component 1002 is not co-located on the same metal layer as the metal layer that is configured to provide the first ground signal 1090. Specifically, the first terminal 1004 is mounted to one of a set of first vias 1060a. The one of a set of first vias 1060a is located on the first metal layer 1020. The one of a set of first vias 1060a allows for the first terminal 1004 on the first metal layer 1020 to electrically couple to the second metal layer 1022 such that the first terminal 1004 is grounded. The second metal layer 1022 is configured to provide the first ground signal 1090 to the first terminal 1004.

The second terminal 1006 of the first passive component 1002 is co-located on the same metal layer as the metal layer that is configured to provide the second ground signal 1092. Specifically, the second terminal 1006 is mounted to the first metal layer 1022. The first metal layer 1022 is configured to provide the second ground signal 1092 to the second terminal 1006.

The first passive component 1002 is shorted i.e., the first terminal 1004 and the second terminal 1004 are each respectively coupled to the second metal layer 1022 and the first metal layer 1020, and the second metal layer 1022 is configured to provide the first ground signal 1090 to the first terminal 1004 and the first metal layer 1020 is configured to provide the second ground signal 1092 to the second terminal 1006. In other words, because the first terminal 1004 and the second terminal 1004 are coupled to ground signals (by way of the first ground signal 1090 and the second ground signal 1092 respectively) that are at substantially the same ground potential, the first passive component 1002 is shorted.

In FIG. 10, the second metal layer 1022 is a ground plane and is at substantially the same ground potential. Likewise, the first metal layer 1020 is a ground plane and a substantial part of the first metal layer 1020 is at substantially the same ground potential.

Regardless of the ground source, the first ground signal 1090 and the second ground signal 1092 are at substantially the same ground potential. Therefore, the first terminal 1004 and the second terminal 1006 are shorted through the second metal layer 1022 and the first metal layer 1020 respectively.

It shall be understood that any of the exemplary passive components (e.g., first passive component 302, 402, 502, 602, 702, 802, 902, or 1002) may also include a third terminal and a fourth terminal (not illustrated). Alternatively, the first passive component may be a multi-terminal component having two terminals or more.

Exemplary Sequence for Fabricating a Packaged Surface Mount Passive Component and Optionally Coupling the Packaged Surface Mount Passive Component to a Circuit Board FIGS. 11A-11I illustrate an exemplary sequence for providing or fabricating a packaged surface mount passive component (e.g., device) and optionally coupling the packaged surface mount passive component to a circuit board. In some implementations, the sequence of FIGS. 11A-11I may be used to provide or fabricate the packaged surface mount passive component 602 (of FIG. 6A-C), 702 (of FIG. 7A or 7B), 802 (of FIG. 8A-8C), 902 (of FIG. 9), and 1002 (of FIG. 10), utilizing any of the passive components illustrated in FIG. 3A-B, 4A-B, or 5A-B.

It should be noted that the sequence of FIGS. 11A-11I may combine one or more stages in order to simplify and/or clarify the sequence for providing or fabricating the die. In some implementations, the order of the processes may be changed or modified. In some implementations, one or more of processes may be replaced or substituted without departing from the spirit of the disclosure.

Figure 11A:
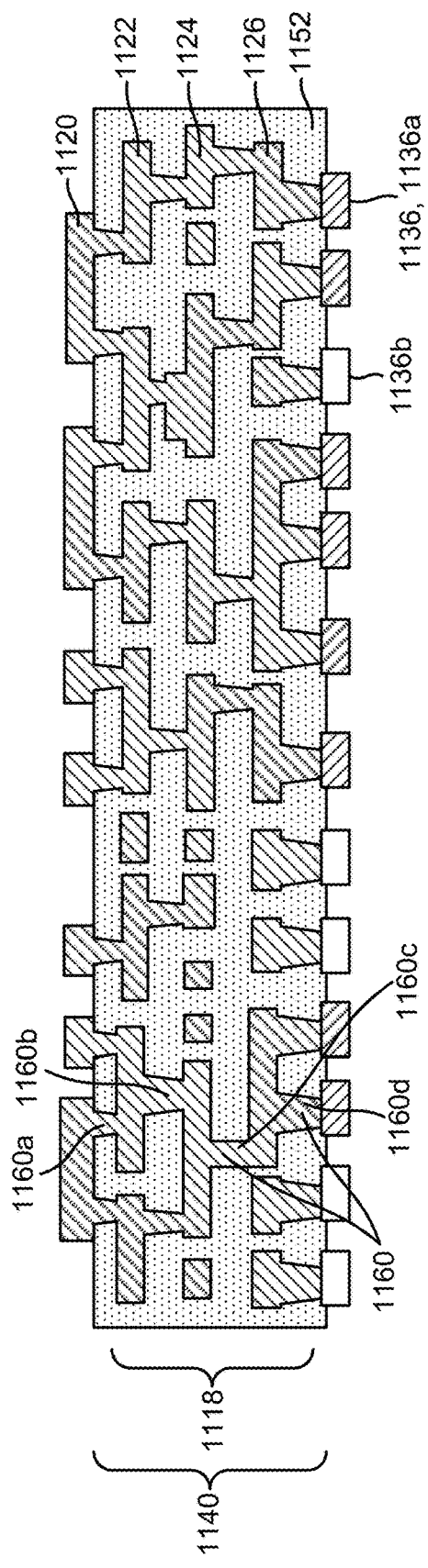

FIG. 11A, illustrates a substrate 1140. The substrate 1140 includes a plurality of metal layers 1118 including a first metal layer 1120, a second metal layer 1122, a third metal layer 1124, a fourth metal layer 1126, and a plurality of substrate interconnects 1136 (e.g., pads or traces). The plurality of metal layers 1118 are separated by a plurality of dielectric layers 1152. The dielectric layers 1152 are configured to isolate the plurality of metal layers 1118.

Further, the substrate 1140 includes a plurality of vias 1160 that are configured to couple the plurality of metal layers 1118. For example, a set of one of the plurality of vias 1160a is configured to couple the first metal layer 1120 to the second metal layer 1122. The set of one of the plurality of vias 1160a also traverses a one of the layers of the plurality of dielectric layers 1152. Similarly, a set of a second one of the plurality of vias 1160b is configured to couple the second metal layer 1122 to the third metal layer 1124, where the set of the second one of the plurality of vias 1160b vertically traverses a one of the layers of the plurality of dielectric layers 1152. The plurality of vias 1152 continues vertically through the substrate 1140 as needed to electrically couple the plurality of metal layers 1118.

The plurality of substrate interconnects 1136 may comprise a land grid array (as shown) or a ball grid array. Some of the plurality of substrate interconnects such as 1136a are configured to be coupled to a ground signal. Others of the plurality of substrate interconnects such as 1136b are not coupled to ground but may be used for coupling to components external to the substrate 1140. Examples of such components may be package substrates, other packages, printed circuit boards, etc.

Figure 11B:
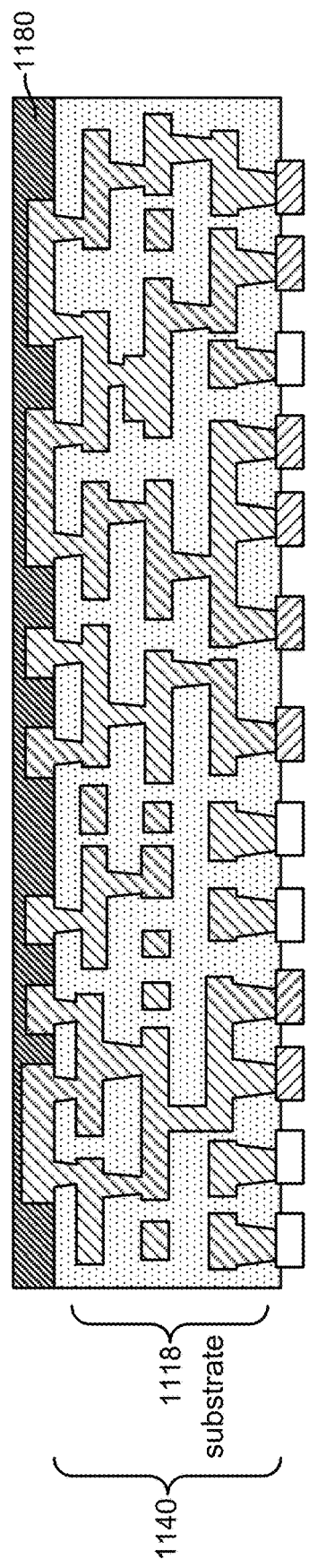

FIG. 11B illustrates the substrate 1140 after a solder resist 1180 has been applied over the first metal layer 1120.

Figure 11C:
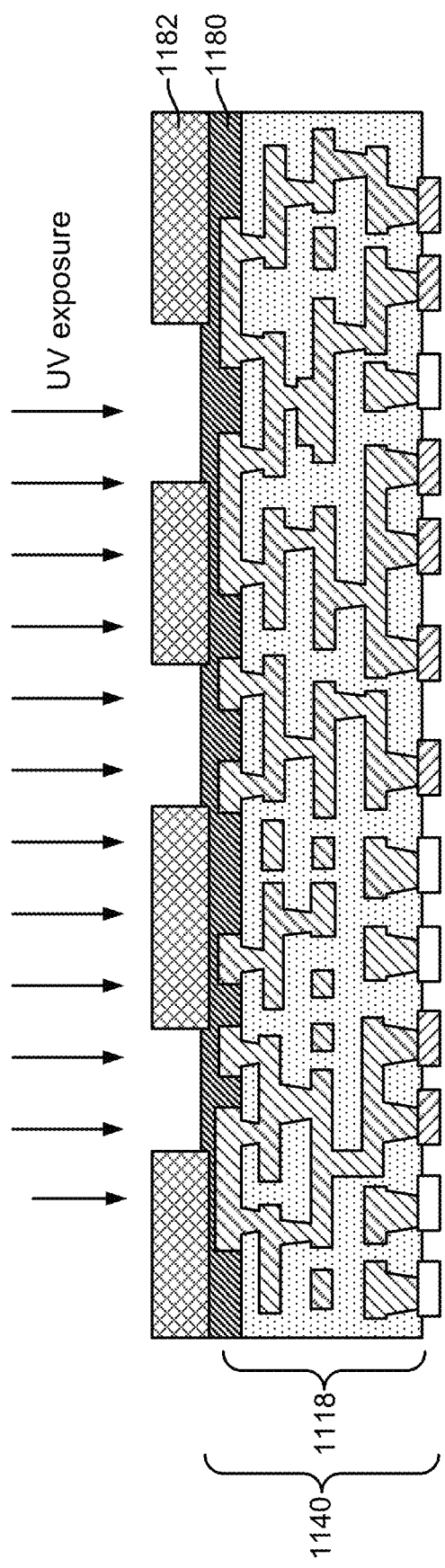

FIG. 11C illustrates the substrate 1140 after a solder mask 1182 is applied over the solder resist 1180. An ultra-violet (UV) process is then performed.

Figure 11D:
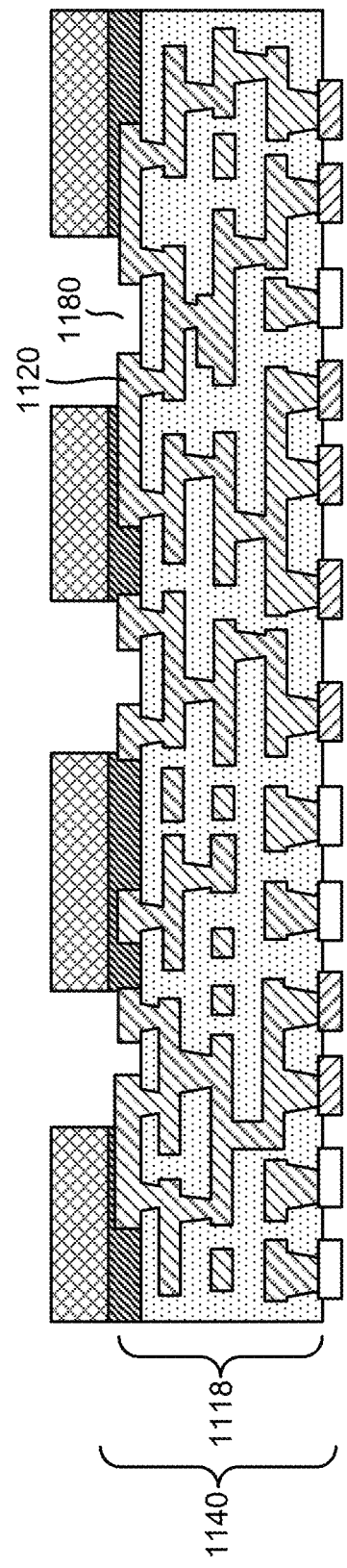

FIG. 11D illustrates the substrate 1140 after the solder resist 1180 not covered by the solder mask 1182 is etched away, thereby exposing portions of the first metal layer 1120.

Figure 11E:
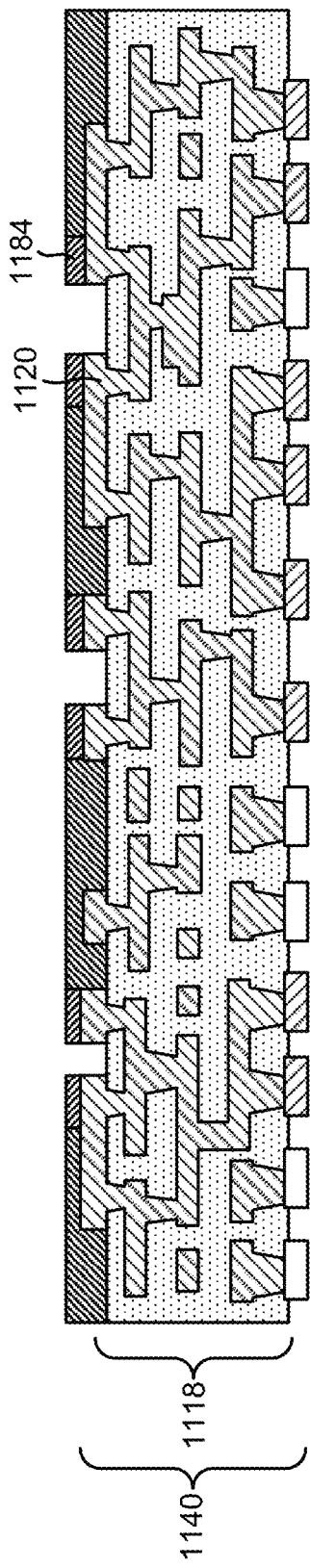

FIG. 11E illustrates the substrate 1140 after the solder mask 1182 is removed and a surface finish 1184 has been applied to the exposed portions of the first metal layer 1120. That is, the surface finish 1184 is deposited over select portions of the first metal layer 1120. The surface finish 1184 may be comprised of Nickel (Ni), or Palladium (Pd), or Gold (Au) or a combination thereof.

Figure 11F:
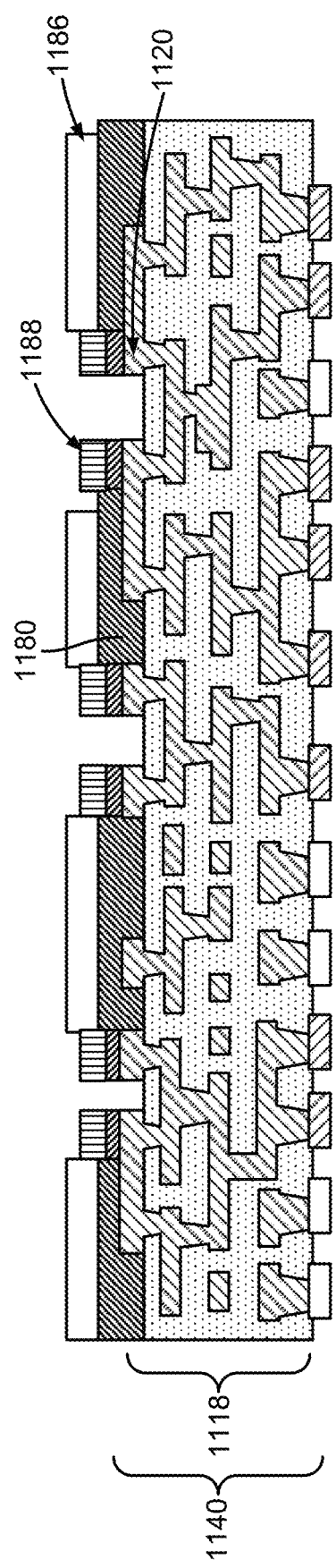

FIG. 11F illustrates the substrate 1140 after a solder stencil 1186 has been applied to the solder resist 1180 areas. Furthermore, a solder paste 1188 is applied over the surface finish 1184 areas.

FIG. 11G illustrates the substrate 1140 after a plurality of passive components 1102 have been coupled to the solder paste 1188 areas. Specifically, a first terminal 1104 of a one of the plurality of passive components 1102 is mounted to the solder paste 1188 which in turn is coupled to the plurality of metal layers 1118 of the substrate 1140. In other words, the first terminal 1104 is mounted/coupled to the first metal layer 1120 via the solder paste 1188. A second terminal 1106 of the one of the plurality of passive components 1102 is coupled to the solder paste 1188 which in turn is coupled to the plurality of metal layers 1118 of the substrate 1140. That is, the second terminal 1106 is mounted/coupled to the first metal layer via the solder paste 1188. Through the plurality of vias 1160 (e.g., 1160a, b and so on), the first terminal and the second terminal are each coupled to a one of the plurality of substrate interconnects 1136a respectively. Each one of the plurality of interconnects 1136a are grounded (e.g., they are connected to a ground signal or a ground source or they are connected to another metal layer or via that is connected to a ground signal).

It shall be understood that the plurality of passive components 1102 may also include a third terminal and a fourth terminal (not illustrated). Alternatively, the plurality of passive components 1102 may be a multi-terminal component having two terminals or more.

The first passive component 1102 may be an inductor such as the inductor 302 of FIG. 3A-B, a capacitor 402 such as the capacitor shown in FIG. 4A-B), or a resistor as shown in FIG. 5A, 5B.

FIG. 11H illustrates the plurality of passive components 1102 (e.g., passive components) after the solder paste 1188 has been reflowed.

Figure 11I:
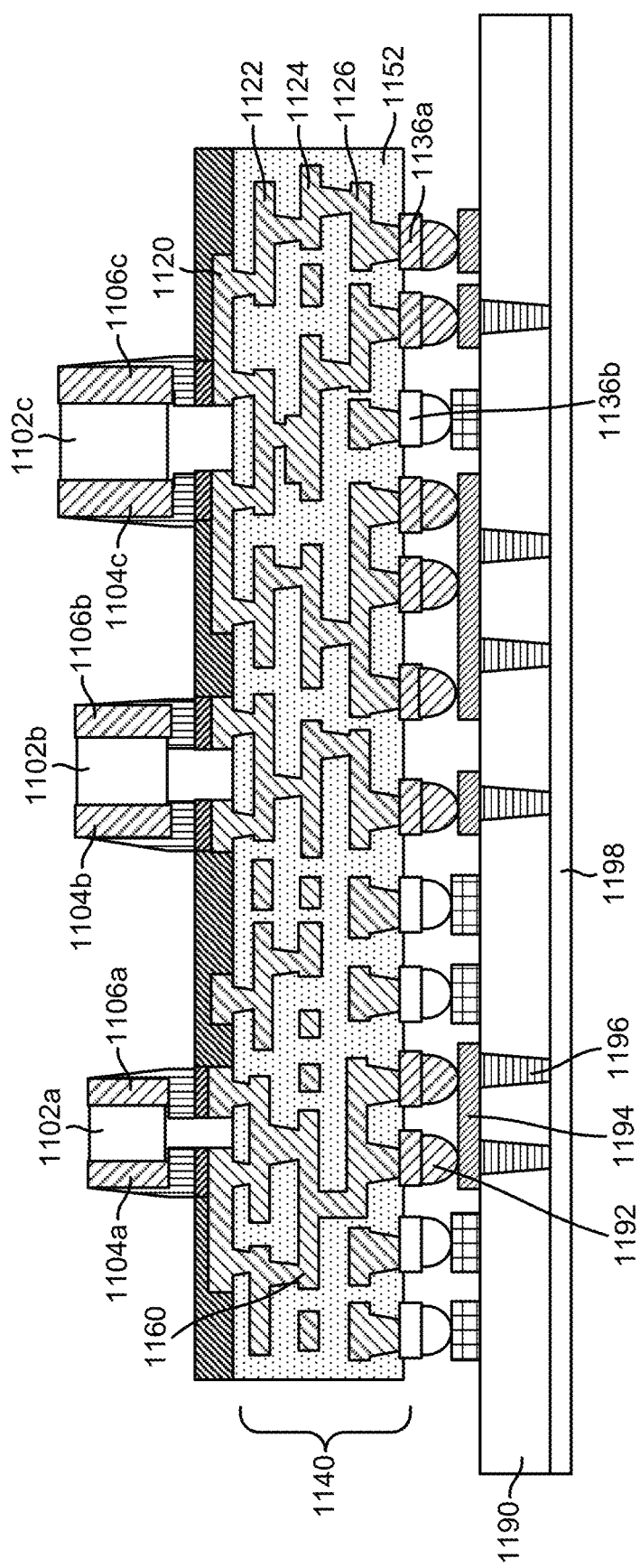

FIG. 11I illustrates the substrate 1140 along with the plurality of passive components 1102 optionally coupled to a circuit board 1190. The circuit board 1190 is exemplary and can be a routing board, a printed circuit board (PCB), or another package or the like. The circuit board 1190 is coupled to a ground metal layer 1198 (i.e., a metal layer that is grounded).

The plurality of substrate interconnects 1136 (e.g., 1136a and 1136b) may be coupled to the PCB through various interconnects. As illustrated, the plurality of substrate interconnects 1136 (e.g., 1136a or b) are coupled to the interconnect 1192 (e.g., solder or solder balls). The interconnect 1192 is illustrated as being coupled to a plurality of circuit board interconnects 1194. The plurality of circuit board interconnects 1194 may be traces or pads. The plurality of circuit board interconnects 1194 are coupled to a plurality of interconnects 1196 (e.g., circuit board via, vias, through vias, via interconnects) that in turn are coupled to the ground metal layer 1198. The ground metal layer 1198 is configured to provide a ground signal to the plurality of substrate interconnects 1136a (configured for receiving a ground signal). The remaining plurality of substrate interconnects 1136b are not coupled to the ground metal layer 1198.

FIG. 11I further illustrates a first passive component 1102a of the plurality of passive components 1102. The first passive component 1102a includes a first terminal 1104a coupled to the first metal 1120 and a second terminal 1106a coupled to the first metal 1120. As illustrated, the first metal 1120 is configured to provide a first ground signal to the first terminal 1104a. The first ground signal is sourced to the first metal layer through the ground metal layer 1198, through the plurality of interconnects 1196, through the plurality of circuit board interconnects 1194, through the plurality of interconnects 1192 and then through the plurality of metal layers 1118 up to the first metal layer 1120. The second metal 1122 is configured to provide a second ground signal to the second terminal 1106a. The second ground signal is sourced to the second metal layer similar to the first ground signal.

The ground metal layer 1198 is configured to provide at least a first ground signal and a second ground signal to the plurality of metal layers 1118, through the plurality of vias 1160.

FIG. 11I further illustrates a second passive component 1102b of the plurality of passive components 1102. The second passive component 1102b includes a first terminal 1104b coupled to the first metal 1120 and a second terminal 1106b coupled to the first metal 1120. As illustrated, the second metal 1122 is configured to provide a first ground signal to the first terminal 1104b. The second metal 1122 is configured to provide a second ground signal to the second terminal 1106b. The first ground signal and the second ground signal are sourced to the upper metal layers (e.g., second metal layer 1122) as described previously, through the ground metal layer 1198, through the plurality of interconnects 1196, through the plurality of circuit board interconnects 1194, through the plurality of interconnects 1192 and then through the plurality of metal layers 1118.

FIG. 11I further illustrates a third passive component 1102c of the plurality of passive components 1102. The third passive component 1102c includes a first terminal 1104c coupled to the first metal 1120 and a second terminal 1106c coupled to the first metal 1120. As illustrated, the first metal 1120 is configured to provide a first ground signal to the first terminal 1104c. The first metal 1122 is configured to provide a second ground signal to the second terminal 1106c. The first and second ground signal are sourced to the first metal layer 1120 as described previously.

Figure 12:
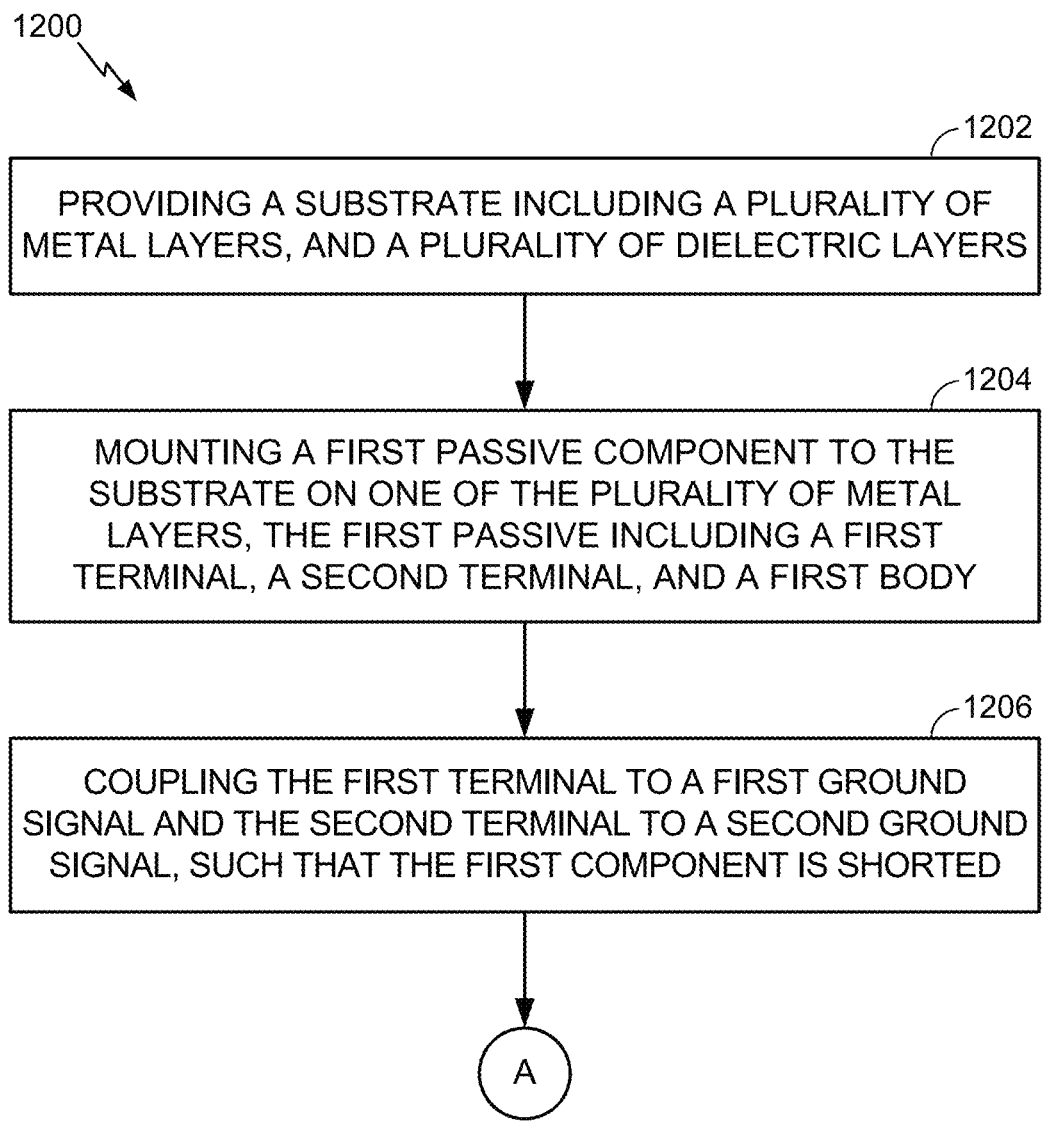
FIG. 12 illustrates an exemplary flow diagram of a method 1200 for providing or fabricating a packaged surface mount passive component.

Exemplary Flow Diagram of a Method for Fabricating a Packaged Surface Mount Passive Component In some implementations, fabricating a packaged surface mount passive component includes several processes. FIG. 12 illustrates an exemplary flow diagram of a method 1200 for providing or fabricating a packaged surface mount passive component. In some implementations, the method 1200 of FIG. 12 may be used to fabricate the packaged surface mount passive component of FIGS. 6A-6C, 7A-7B, 8A-8C, 9, 10, and 11A-11I as described in the disclosure.

It should be noted that the sequence of FIG. 12 may combine one or more processes in order to simplify and/or clarify the method for providing or fabricating a die. In some implementations, the order of the processes may be changed or modified.

The method includes providing (at 1202), a substrate including a plurality of metal layers, and a plurality of dielectric layers. The substrate may be a package substrate, a printed circuit board (PCB), an interposer, a laminate or organic substrate, a wafer level package or a chip scale package, or any other type of carrier. The dielectric layers alternate between the plurality of metal layers to electrically isolate the plurality of metal layers.

The method includes mounting (at 1204), a first passive component to the substrate on one of the plurality of metal layers, the first passive component including a first terminal, a second terminal, and a first body. The first passive component may be any one of the following passive components: an inductor, a capacitor, or a resistor. For example, the first passive component may be an inductor (e.g., 302), a capacitor (e.g., 402), or a resistor (e.g. 502) as shown in FIGS. 3A-B, 4A-B, and 5A-B respectively.

The method (at 1206) further includes coupling the first terminal to a first ground signal and the second terminal to a second ground signal, such that the first component is shorted. For example, the first passive component (i.e., the first terminal and the second terminal of the first passive component) may be shorted as illustrated FIG. 6A-6C, 7A-B, 8A-B', 9, 10, or 11. The packaged surface mount passive component (at 1206) may be configured to couple to another circuit board such as in a package on package (POP) configuration, or to a printed circuit board (PCB).

Figure 13:
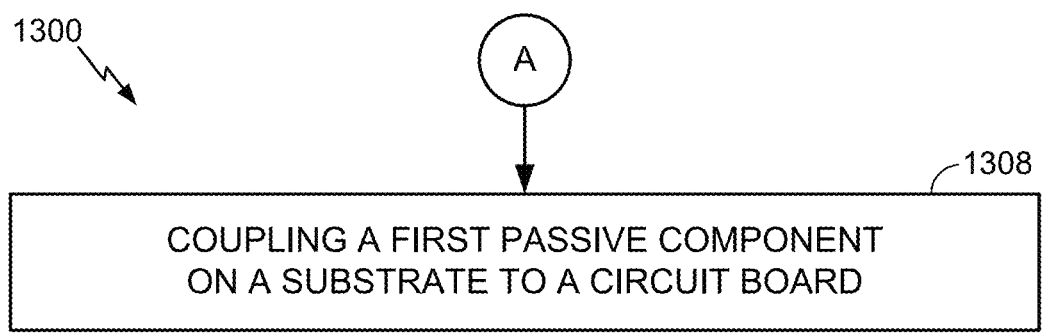
FIG. 13 illustrates an exemplary flow diagram of method for fabricating a packaged surface mount passive component coupled to a circuit board.

FIG. 13 illustrates an optional exemplary flow diagram of a method for fabricating a packaged surface mount passive component mounted or coupled to a circuit board. Exemplary flow diagram 1300 continues from point A of FIG. 12 (where FIG. 12 illustrates a packaged surface mount passive component). The method includes, coupling (at 1308) the first passive component (e.g., a packaged surface mount passive component) to a circuit board. The another circuit board may be a printed circuit board (PCB) or routing board.

In one example, the first passive component is located on the same metal layer (of the plurality of metal layers) that is configured to provide the first ground signal and/or the second ground signal. In another example, the first passive component is located on a different metal layer (of the plurality of metal layers) than the metal layer (of the plurality of metal layers) that is configured to provide the first ground signal and/or the second ground signal. In another example, the first passive component is located on any one of the plurality of metal layers and a different one of the plurality of metal layers is configured to provide the first ground signal and another different one of the plurality of metal layers is configured to provide the second ground signal.

Exemplary Electronic Devices

Figure 14:
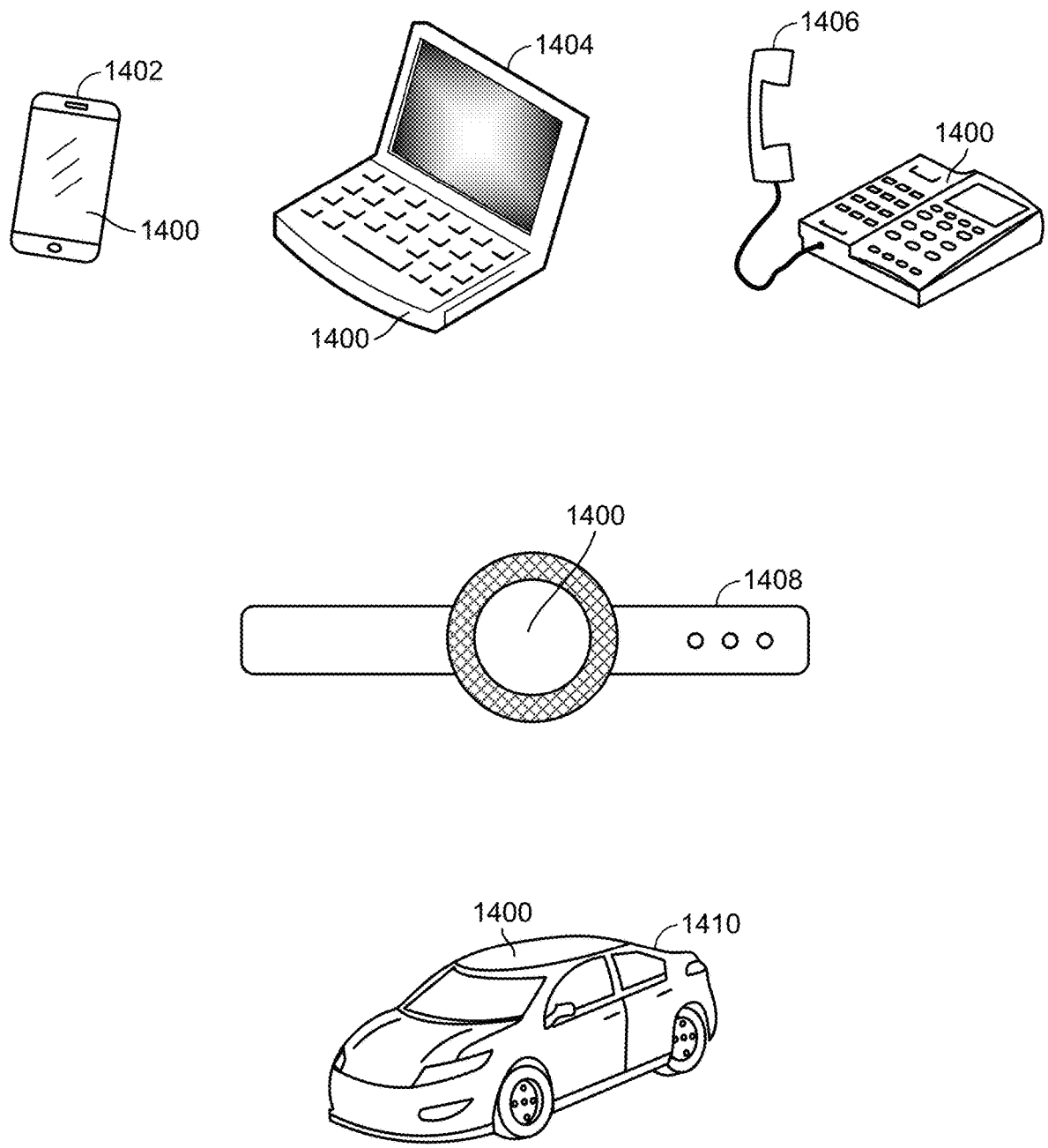
FIG. 14 illustrates various electronic devices that may integrate a passive component, a surface mounted passive component, a packaged surface mounted passive component, or a packaged surface mounted passive component coupled to a circuit board described herein.

FIG. 14 illustrates various electronic devices that may integrate a passive component, a surface mounted passive component, a packaged surface mounted passive component, or a packaged surface mounted passive component coupled to a circuit board described herein. For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or passive components, surface mounted passive component, packaged surface mounted passive component, or packaged surface mounted passive component coupled to a circuit board described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 3A-B, 4A-B, 5A-B, 6A-6C, 7A-B, 8A-B', 9, 10, 11, 12, and 13 may be rearranged and/or combined into a single component, process, feature or function or embodied in several components, processes, or functions. Additional elements, components, processes, and/or functions may also be added without departing from the disclosure. It should also be noted FIGS. 3A-B, 4A-B, 5A-B, 6A-6C, 7A-B, 8A-B', 9, 10, 11, 12, and 13 and its corresponding description in the present disclosure is not limited to dies and/or ICs. In some implementations, FIGS. 3A-B, 4A-B, 5A-B, 6A-6C, 7A-B, 8A-B', 9, 10, 11, 12, and 13 and its corresponding description may be used to manufacture, create, provide, and/or produce devices and/or integrated devices. In some implementations, a device may include a die, an integrated device, an integrated passive device (IPD) (e.g., a surface mount passive component), a die package (e.g., a packaged surface mount passive component), an integrated circuit (IC) device, a device package, an integrated circuit (IC) package, a wafer, a semiconductor device, a package-on-package (PoP) device, a heat dissipating device and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal, ground or power). An interconnect may be part of a circuit. An interconnect may include more than one element or component.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
   a substrate including a plurality of metal layers, and a plurality of dielectric layers; and
   a first passive component including a first terminal, a second terminal, and a first body, mounted to a first metal layer of the plurality of metal layers of the substrate;
   wherein the first terminal is coupled to a first ground signal and the second terminal is coupled to a second ground signal such that the first passive component is shorted, and the first metal layer is configured to provide the first ground signal and the second ground signal.

2. The device of claim 1, wherein the first passive component is selected from the group consisting of an inductor, a capacitor, and a resistor.

3. The device of claim 1, wherein the first ground signal and the second ground signal are from a same ground source.

4. The device of claim 1, wherein the first ground signal and the second ground signal are from different ground sources.

5. The device of claim 1, wherein the first metal layer is an inner metal layer of the substrate, such that the first passive component is embedded inside the substrate.

6. The device of claim 1, wherein the first passive component further includes a third terminal and a fourth terminal, each respectively coupled to the first metal layer such that the first terminal, the second terminal, the third terminal and the fourth terminal are shorted.

7. The device of claim 1, further comprising:
   a second passive component, including a second body, a third terminal, and a fourth terminal, mounted to a second metal layer of the plurality of metal layers, the second metal layer of the plurality of metal layers is configured to provide a third ground signal and a fourth ground signal.

8. The device of claim 7, wherein the first passive component is mounted to a first surface of the first metal, the first surface facing upwards, and the second passive component is mounted to a second surface of the second metal, the second surface facing downwards.

9. The device of claim 7, wherein the second passive component is selected from the group consisting of an inductor, a capacitor, and a resistor.

10. The device of claim 1, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. A device comprising:
    a substrate including a plurality of metal layers, and a plurality of dielectric layers;
    a first passive component including a first terminal, a second terminal, and a first body mounted to a first metal layer of the plurality of metal layers, wherein the first terminal is coupled to a first ground signal and the second terminal is coupled to a second ground signal such that the first passive component is shorted; and
    a plurality of first vias couple the first terminal and the second terminal on the first metal layer, respectively, to a second metal layer of the plurality of metal layers, the second metal layer configured to provide the first ground signal and the second ground signal.

12. The device of claim 11, further comprising:
    the first metal layer and the second metal layer are separated by one or more metal layers of the plurality of metal layers and the plurality of first vias are configured to electrically couple the one or more metal layers to the first metal layer and the second metal layer.

13. The device of claim 11, wherein the first ground signal and the second ground signal are from a same ground source.

14. The device of claim 11, wherein the first ground signal and the second ground signal are from different ground sources.

15. The device of claim 11, further comprising:
a second passive component, including a second body, a third terminal, and a fourth terminal, mounted and electrically connected to the second metal layer of the plurality of metal layers, the second metal layer of the plurality of metal layers is configured to provide a third ground signal and a fourth ground signal.

16. A method of fabricating a packaged passive component, comprising:
providing a substrate including a plurality of metal layers, and a plurality of dielectric layers;
mounting a first passive component to the substrate on one of the plurality of metal layers, the first passive component including a first terminal, a second terminal, and a first body;
coupling the first terminal to a first ground signal and the second terminal to a second ground signal, such that the first passive component is shorted;
coupling the passive component on the substrate to a circuit board;
depositing a plurality of circuit board interconnects on the circuit board;
coupling the plurality of circuit board interconnects to a plurality of via interconnects going through the circuit board; and
coupling the plurality of circuit board interconnects to a ground metal layer of the circuit board, wherein the ground metal layer is configured to provide the first ground signal and the second ground signal.

17. The method of claim 16, further comprising:
providing a plurality of vias in the substrate to couple the plurality of metal layers together; and
patterning a plurality of substrate interconnects on the bottom of the substrate in a land grid array (LGA) configuration, such that the LGA configuration of the plurality of substrate interconnects is coupled to a first set of the plurality of vias.

18. The method of claim 17, further comprising:
depositing a solder resist layer over a first metal layer of the plurality of metal layers;
depositing a surface finish over select portions of the first metal layer; and
depositing a solder paste over the surface finish.

19. The method of claim 18, wherein mounting the first passive component to the substrate includes placing the first passive component over the solder paste, such that each of the first terminal and the second terminal are coupled to the solder paste.

* * * * *